(12) United States Patent
Takiguchi et al.

(10) Patent No.: US 6,674,784 B2
(45) Date of Patent: Jan. 6, 2004

(54) DISTRIBUTED FEEDBACK LASER DEVICE AND METHOD FOR MANUFACTURING THE SAME

(75) Inventors: Tohru Takiguchi, Tokyo (JP); Yoshihiko Hanamaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 81 days.

(21) Appl. No.: 09/861,651

(22) Filed: May 22, 2001

(65) Prior Publication Data

US 2002/0061046 A1 May 23, 2002

(30) Foreign Application Priority Data

Nov. 20, 2000 (JP) ........................................ 2000-352450

(51) Int. Cl.⁷ ................................................. H01S 3/08
(52) U.S. Cl. ...................... 372/96; 372/29.02; 372/98; 372/102
(58) Field of Search ........................... 372/29.02, 96, 372/98, 102

(56) References Cited

U.S. PATENT DOCUMENTS

| | | | | |
|---|---|---|---|---|
| 4,896,331 A | * | 1/1990 | Hirata | .................... 372/102 |
| 6,023,354 A | * | 2/2000 | Goldstein et al. | ............. 359/15 |
| 6,043,104 A | * | 3/2000 | Uchida et al. | ................. 438/32 |
| 6,195,373 B1 | * | 2/2001 | Fukunaga | .................... 372/45 |
| 6,365,428 B1 | * | 4/2002 | Zubrzycki et al. | ............ 438/32 |
| 6,396,854 B1 | * | 5/2002 | Takagi | .......................... 372/20 |
| 6,411,642 B1 | * | 6/2002 | Mazed | ....................... 372/102 |

FOREIGN PATENT DOCUMENTS

JP   8-278423   10/1996

OTHER PUBLICATIONS

Watanabe et al., "Laterally Coupled Strained MQW Ridge Waveguide Distributed–Feedback Laser Diode Fabricated By Wet–Dry Hybrid Etching Process", IEEE Photonics Technology Letters, vol. 10, No. 12, Dec. 1998, pp. 1688–1690.

* cited by examiner

Primary Examiner—Eddie Lee
Assistant Examiner—Matthew E. Warren
(74) Attorney, Agent, or Firm—Leydig, Voit & Mayer, Ltd.

(57) ABSTRACT

A distributed feedback laser device includes a semiconductor base having a ridge waveguide structure projecting from its principal plane. The ridge waveguide structure extends with a predetermined width from one edge of the semiconductor base to an opposite edge. A diffraction grating layer is confined within the ridge structure. The ridge waveguide structure is formed by etching using an SiO$_2$ film and a resist film as masks so that the diffraction grating layer is produced with substantially the same width as, or a less width than, the width of the ridge waveguide structure. A λ/4 shift diffraction grating or a chirped diffraction grating is preferably employed.

6 Claims, 46 Drawing Sheets

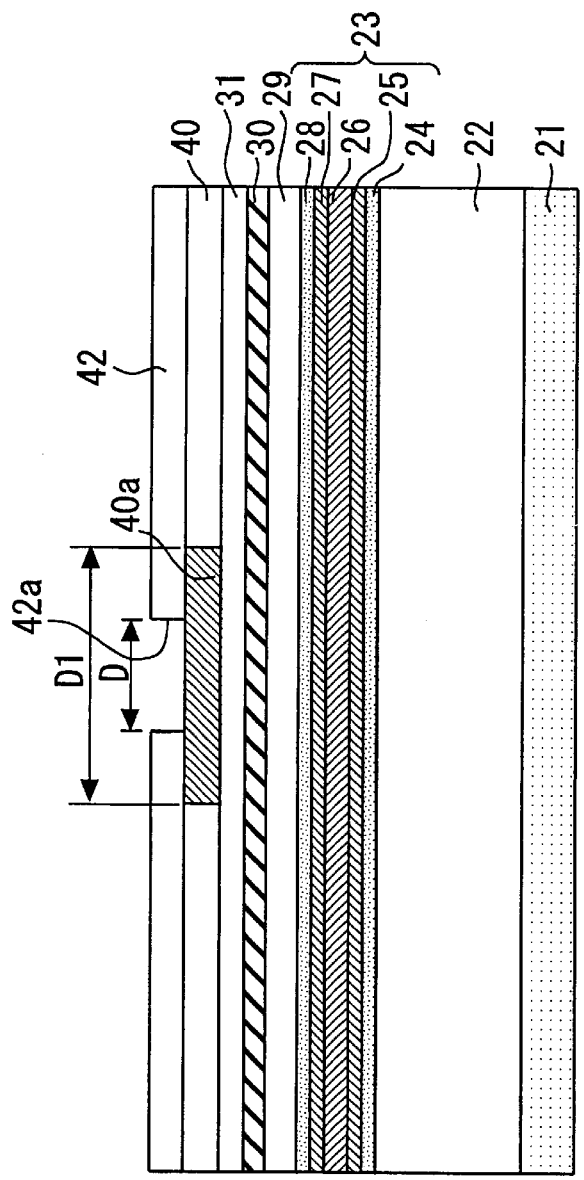
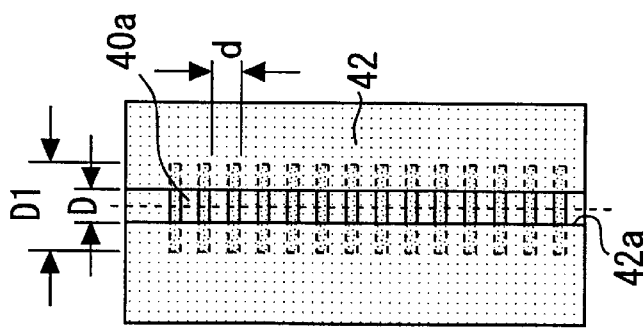
Fig. 8A
Fig. 8B

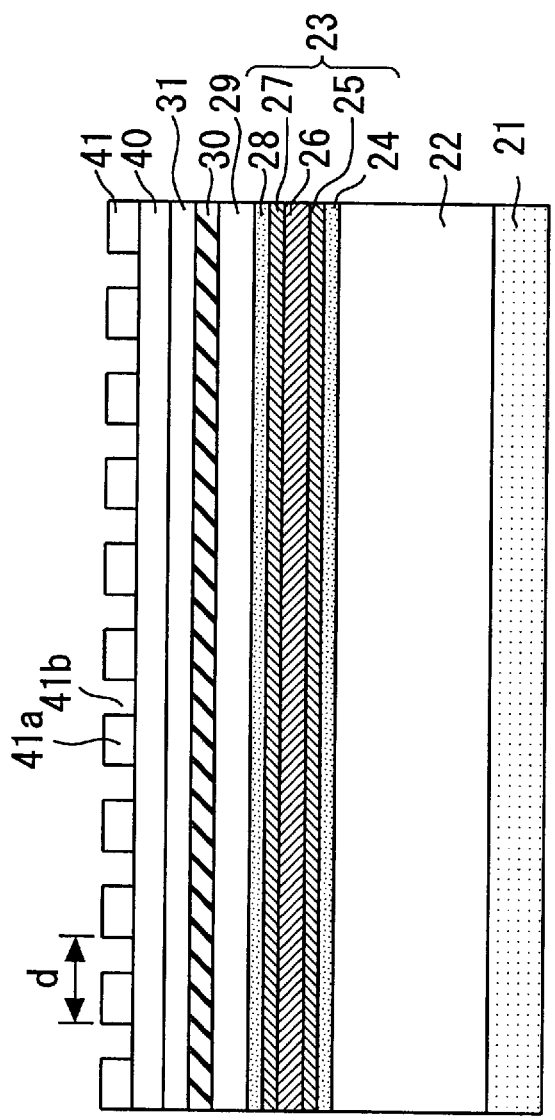
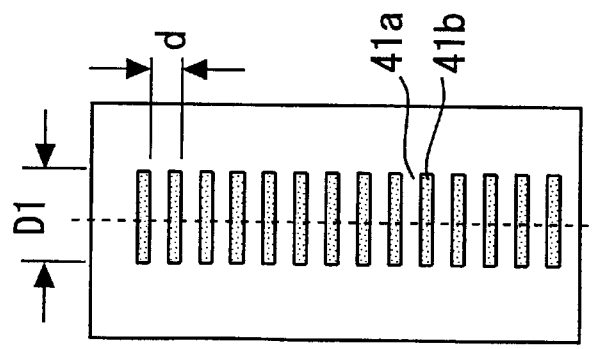
Fig. 23A
Fig. 23B

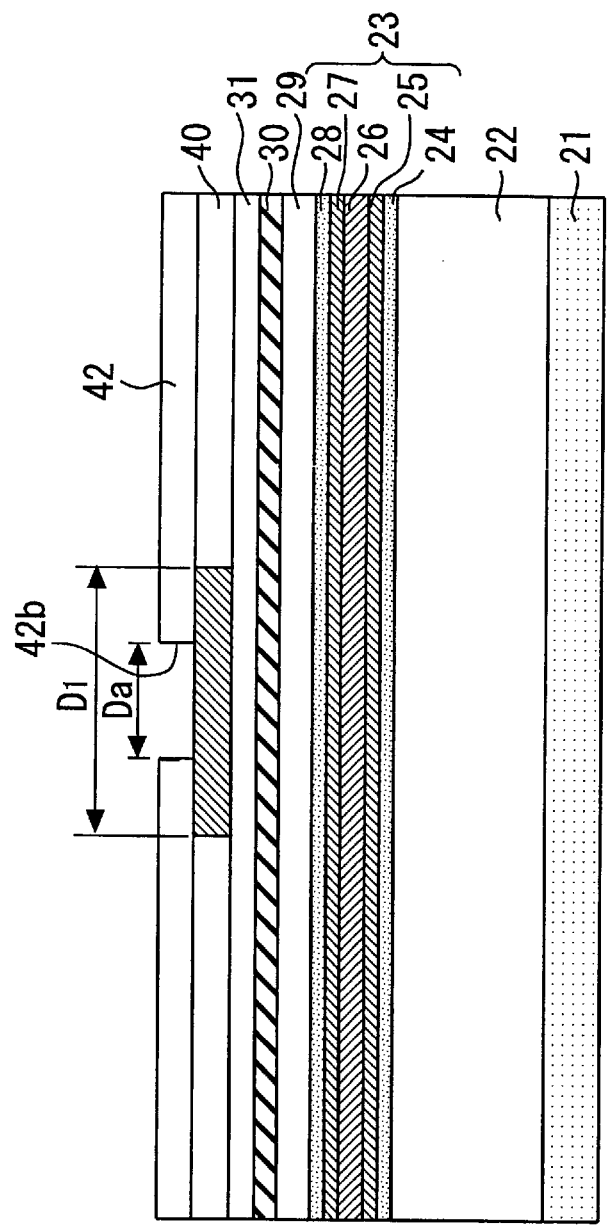
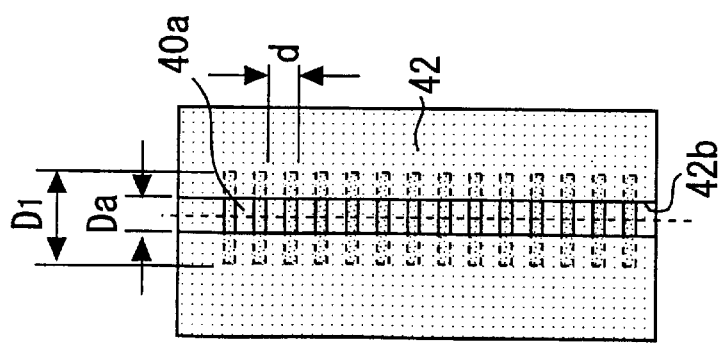
Fig. 26A
Fig. 26B

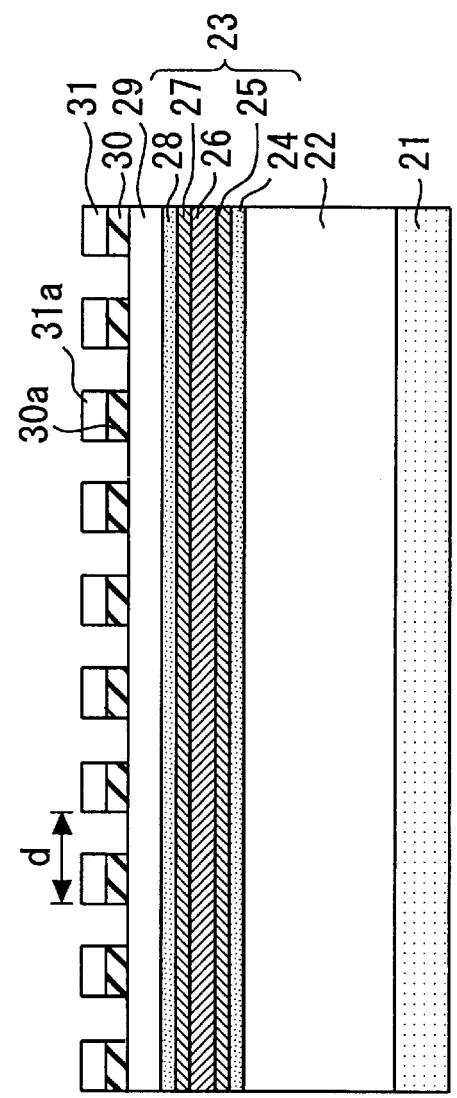
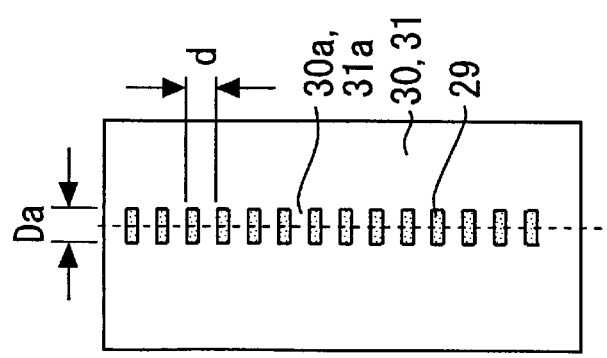
Fig. 27A
Fig. 27B

DISTRIBUTED FEEDBACK LASER DEVICE AND METHOD FOR MANUFACTURING THE SAME

BACKGROUND OF THE INVENTION

1. Field of the Invention

The present invention relates to a semiconductor laser device and, more particularly, to a distributed feedback semiconductor laser device and a method for manufacturing that device which has a ridge waveguide structure with a predetermined ridge width formed on a principal plane of a semiconductor base.

2. Background Art

A distributed feedback semiconductor laser device having a ridge waveguide structure formed on a principal plane of a semiconductor base is discussed illustratively in 1998 IEEE Photonics Technology Letters, Vol. 10, No. 12, pp. 1688–1690.

This type of semiconductor laser device, capable of concentrating generated light within a ridge waveguide structure, is counted on to play a major role in optical communication applications from now on. The device is characterized by its diffraction grating formed not only inside the ridge waveguide structure but also outside of it. The characteristic makes it difficult to increase a coupling constant $\kappa$ in effect between the generated light and the diffraction grating, which prevents optical output from getting sufficiently large. Furthermore, because of its poor controllability in the coupling constant and wavelength involved, the distributed feedback semiconductor laser device tends to suffer from wavelength variations in optical output.

SUMMARY OF THE INVENTION

It is therefore an object of the present invention to overcome the above and other deficiencies of the prior art and to provide an improved distributed feedback semiconductor laser device capable of boosting its optical output and stabilizing its wavelength.

It is another object of the present invention to provide a method for manufacturing an improved distributed feedback semiconductor laser device capable of boosting its optical output and stabilizing its wavelength.

According to one aspect of the present invention, a distributed feedback laser device comprises a semiconductor base having a ridge waveguide structure projecting from a principal plane thereof, the semiconductor base including a plurality of semiconductor layers for emitting light and a diffraction grating layer resonating with the emitted light, the ridge waveguide structure extending with a predetermined width from one edge of the semiconductor base to an opposite edge thereof, the diffraction grating layer being formed confined within the ridge waveguide structure having the predetermined width.

According to the invention, a distributed feedback laser device may be manufactured so that its diffraction grating layer is confined within the ridge waveguide structure. This permits enlarging of the coupling constant in effect between emitted light and the grating layer, thus boosting optical output and ensuring wavelength stabilization.

According to another aspect of the present invention, in a method of manufacturing a distributed feedback laser device, a plurality of semiconductor layers for emitting light are formed on a semiconductor substrate firstly. A diffraction grating layer having a plurality of grating elements arranged within a predetermined width is formed on the plurality of semiconductor layers secondly. Thirdly a ridge waveguide structure having the plurality of grating elements is formed through an etching process, the plurality of grating elements left confined in the ridge waveguide structure.

The manufacturing method involves first forming a diffraction grating layer having a plurality of grating elements arranged within a predetermined width. So that a ridge waveguide structure may then be formed in such a manner that the diffraction grating layer is left confined inside the ridge structure.

Other and further objects, features and advantages of the invention will appear more fully from the following description.

BRIEF DESCRIPTION OF THE DRAWINGS

FIGS. 8A and 8B are a cross-sectional view and a top view of the inventive distributed feedback laser device as manufactured in another process of the manufacturing method as the second embodiment;

FIGS. 23A and 23B are a cross-sectional view and a top view of the inventive distributed feedback laser device as manufactured in another process of the manufacturing method as the fourth embodiment;

FIGS. 26A and 26B are a cross-sectional view and a top view of the inventive distributed feedback laser device as manufactured in another process of the manufacturing method as the fourth embodiment;

FIGS. 27A and 27B are a cross-sectional view and a top view of the inventive distributed feedback laser device as manufactured in another process of the manufacturing method as the fourth embodiment;

DETAILED DESCRIPTION OF THE PREFERRED EMBODIMENTS

First Embodiment

Figure 1:
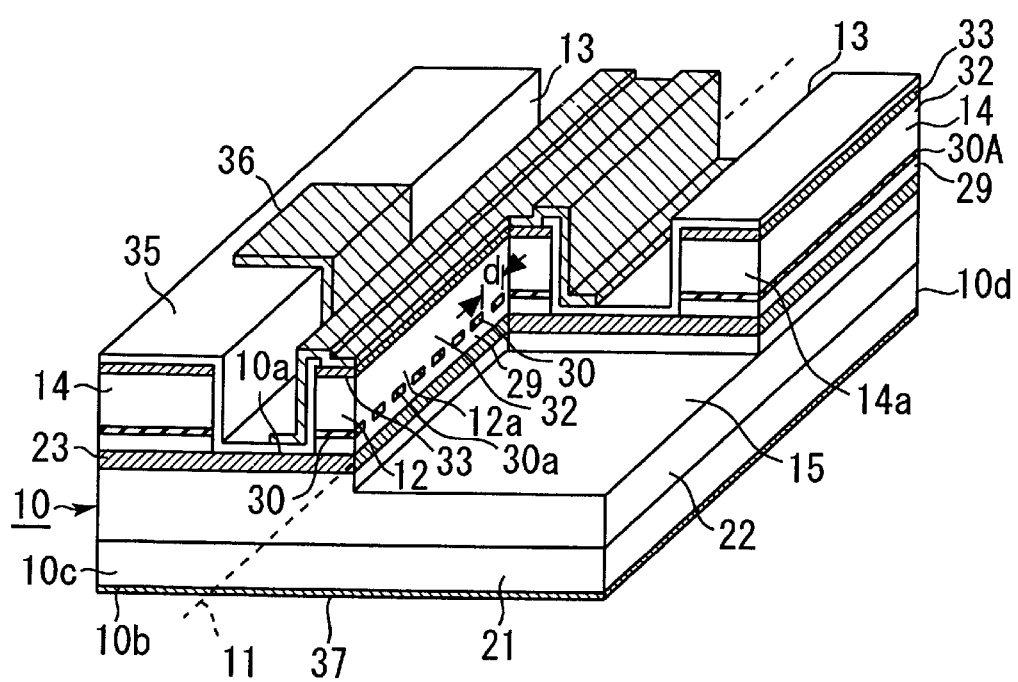
FIG. 1 is a perspective view of a distributed feedback laser device practiced as a first embodiment of this invention.
Figure 2:
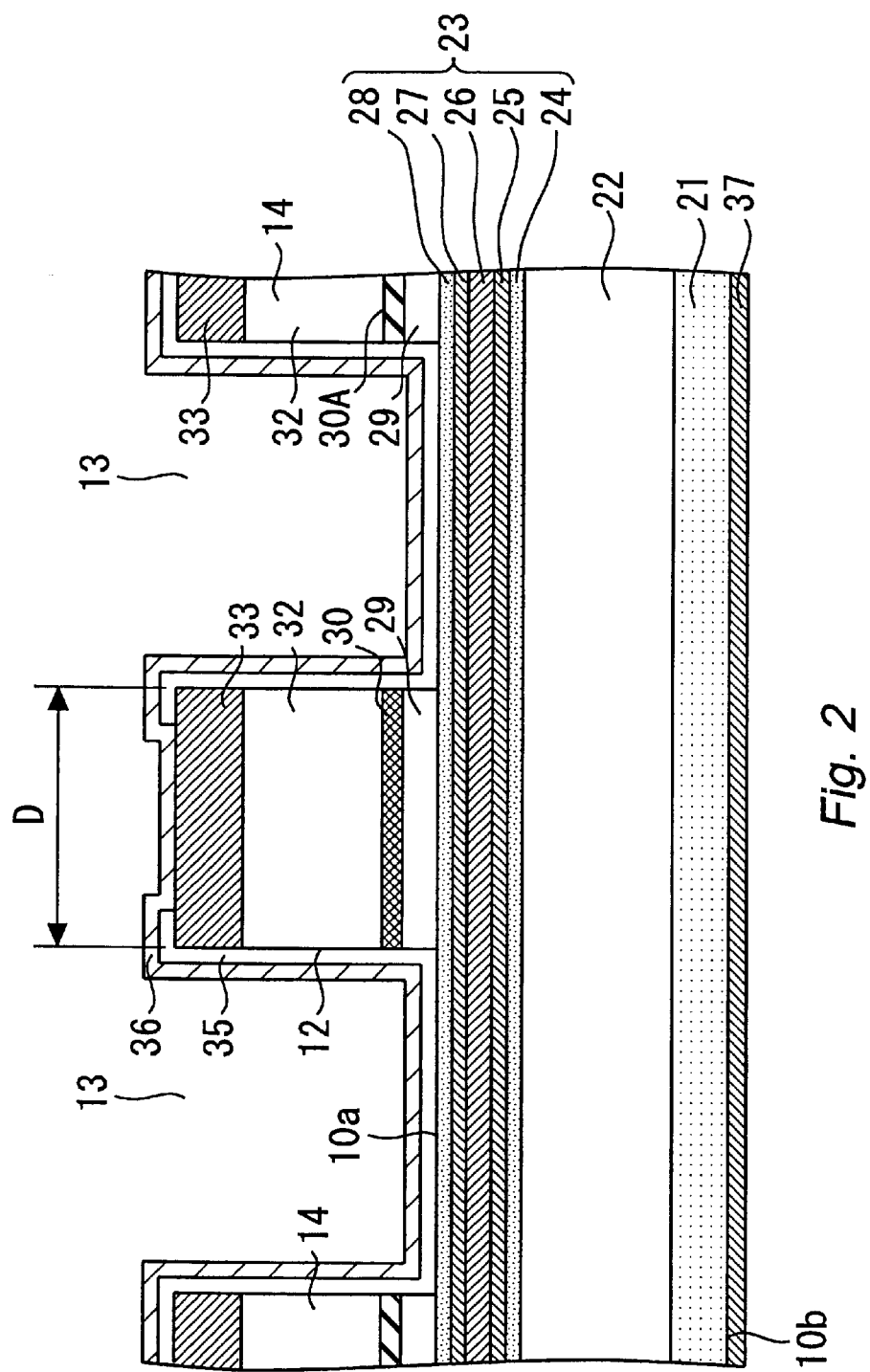
FIG. 2 is a cross-sectional view of the distributed feedback laser device as the first embodiment.

FIGS. 1 and 2 illustrate a distributed feedback semiconductor laser device(DFB laser device) practiced as the first embodiment of this invention. FIG. 1 is a partially cutaway perspective view of the first embodiment, and FIG. 2 is a cross-sectional view of the first embodiment.

The distributed feedback semiconductor laser device the first embodiment centers structurally on a semiconductor base 10. Light is emitted along a light output axis (i.e., optical axis) 11. The semiconductor base 10 comprises an upper principal plane 10a, a lower principal plane 10b, and edges 10c and 10d at opposing ends. The optical axis 11 is perpendicular to the edges 10c and 10d and is located in the middle of the semiconductor base 10 in the opposing direction of the edges 10c and 10d.

In the middle of the upper principal plane is a ridge waveguide structure (ridge structure) 12 having a predetermined width D and extending in parallel with the optical axis 11 from the edge 10c to the edge 10d. The ridge structure 12 is flanked on both sides by side walls 14 with a groove 13 located between each side wall 14 and the ridge structure 12. The grooves 13 and the side walls 14 also extend in parallel with the optical axis 11.

In FIG. 1, a right-hand half on the near side of the upper principal plane 10a of the semiconductor base 10 is cut away for purpose of illustration and denoted by numeral 15. In the cutaway portion 15, there appear a broken-out section 12a of the ridge structure 12 and a broken-out section 14a of one side wall 14. The broken-out section 12a is in parallel with the optical axis 11 and cuts along the ridge structure 12a. The broken-out section 14a is perpendicular to the optical axis 11 and cuts across the side walls 14. FIG. 2 is a sectional view of a plane perpendicular to the optical axis 11.

The semiconductor base 10 comprises an N-type InP substrate 21 which is a starting material, an N-type InP clad layer 22 (1 $\mu$m thick; carrier density N=1×10$^{18}$ cm$^{-3}$) formed on the InP substrate 21, and a composite light-emitting layer 23 formed on the clad layer 22. The layers 22 and 23 are deposited all over the semiconductor substrate 21. The composite light-emitting layer 23 includes five layers constituted, from the bottom up, by an N-type AlInAs clad layer 24 (0.1 $\mu$m thick; carrier density N=1×10$^{18}$ cm$^{-3}$), an N-type AlGaInAs light-confining layer 25 (0.1 $\mu$m thick; carrier density N=1×10$^{18}$ cm$^{-3}$), an AlGaInP quantum-well layer 26, a P-type AlGaInAs light-confining layer 27 (0.1 $\mu$m thick; carrier density P=1×10$^{18}$ cm$^{-3}$), and a P-type AlInAs clad layer 28 (0.1 $\mu$m thick; carrier density P=1×10$^{18}$ cm$^{-3}$).

The ridge structure 12 and the side walls 14 on both sides thereof are formed on the composite light-emitting layer 23. The ridge structure 12 and the side walls 14 each include four layers which in turn are located on the same level each.

The four layers making up the ridge structure 12 are constituted, from the bottom upward, by a P-type InP layer 29 (0.1 $\mu$m thick; carrier density P=1×10$^{18}$ cm$^{-3}$), a P-type InGaAsP diffraction grating layer 30 (0.06 $\mu$m thick; carrier density P=1×10$^{18}$ cm$^{-3}$), a P-type InP layer 32 (1.5 $\mu$m; carrier density P=1×10$^{18}$ cm$^{-3}$), and a P-type InGaAs contact layer 33 (0.1 $\mu$m; carrier density P=1×10$^{19}$ cm$^{-3}$). The four layers composing the side walls 14 are constituted, from the bottom upward, a P-type InP layer 29, a P-type InGaAsP layer 30A (0.06 $\mu$m; carrier density P=1 ×10$^{18}$ $^{cm-3}$), a P-type InP layer 32, and a P-type InGaAs contact layer 33.

The diffraction grating layer 30 is formed solely inside the width D of the ridge structure 12, not outside thereof. Outside the ridge structure 12, the diffraction grating layer 30 is cut off by the grooves 13. In the side walls 14 outside the grooves 13, the diffraction grating layer 30 is located on the same level as the P-type InGaAsP layer 30A. However, the layer 30A in the side walls 14 does not include a plurality of grating elements and thus does not function as a diffraction grating layer.

The diffraction grating layer 30 within the ridge structure 12 has the same width D of 1.8 $\mu$m as that of the ridge structure 12. The diffraction grating layer 30 provides a distributed feedback diffraction grating made of a plurality of grating elements arranged at constant pitches "d" along the optical axis 11, i.e., in the direction in which the ridge structure 12 extends. More specifically, the diffraction grating layer 30 has numerous grating elements 30a arranged at constant pitches "d" in the direction of the optical axis 11. Between the grating elements 30a are parts of the P-type InP layer 29 protruding from underneath. Because of its grating structure, the diffraction grating layer 30 resonates with the light emitted by the composite layer 23 and guides the resonating optical output in the extending direction of the ridge structure 12. The pitch "d" of the grating elements 30a is illustratively 2000 Å.

The upper principal plane 10a of the semiconductor base 10 is covered with an SiO$_2$ insulating film 35. More specifically, the SiO$_2$ insulating film 35 covers the top and side surfaces of the ridge structure 12, side surfaces of the side walls 14, and the upper surfaces of the composite layer 23 in the grooves 13. At the top of the ridge structure 12, the SiO$_2$ insulating film 35 contains selectively formed holes through which a P-type electrode layer 36 (Ti/Au layer) of the laser device is in contact with the contact layer 33. Except for its portions in contact with the contact layer 33, the P-type electrode layer 36 is formed to cover the SiO$_2$ insulating film 35. On the lower principal plane 10b of the semiconductor base 10 is formed an N-type electrode layer 37 (Au/Ge/Ni/Au layer) of the laser device.

Because the diffraction grating layer 30 is formed only within the ridge structure 12. The light emitted by the composite layer 23 couples with the diffraction grating layer 30 solely inside the ridge structure 12. This renders the coupling constant κ sufficiently large and thereby boosts optical output. If the diffraction grating layer 30 extended out of the ridge structure 12 as in a conventional setup, wavelength variations would be liable to occur in the resonant light. Since its diffraction grating layer 30 is formed only within the ridge structure 12, the first embodiment ensures a stable wavelength characteristic.

If the diffraction grating layer 30 extended up to the grooves 13 outside the ridge structure 12, the difference in refractive index determining the diffraction grating function would occur differently inside and outside the ridge structure: between the InGaAsP layer of the diffraction grating layer 30 and the InP layer 31 thereon within the ridge structures, but between the InGaAsP layer of the diffraction grating layer 30 and the SiO$_2$ insulating film 35 thereon in the grooves 13 outside the ridge structure 12. Meanwhile, the composite layer 23 emits light that is distributed inside and outside the ridge structure 12. Thus the difference in refractive index relevant to the emitted light would differ inside and outside the ridge structure 12 and would therefore be liable to trigger variations in wavelength. Variations in light intensity distribution, if they occur, quite often result in deviations of the difference in refractive index relevant to the light in totality.

The oscillation wavelength λ0 of a distributed feedback (DFB) laser device is given by the following expression:

$$\lambda 0 = 2 \text{Neff} \times d$$

where, "d" represents the pitch of grating elements 30a constituting the diffraction grating layer 30. The coupling constant κ is approximated by the expression:

$$\kappa = \pi \times (\text{Neff1} - \text{Neff2})/2\lambda$$

where, "Neff" stands for the effective refractive index of the laser device in question, "Neff1" for the effective refractive index in effect when the InGaAsP layer is provided, and "Neff2" for the effective refractive index in effect when the InGaAsP layer is not provided.

It has been shown above that where the diffraction grating layer 30 is formed inside and outside the ridge structure 12 or only outside thereof, variations in light intensity are liable to trigger deviations in the oscillation wavelength λ0 and coupling constant κ, which worsens controllability of the laser device in use. According to the invention, by contrast, the fact that the diffraction grating layer 30 is formed solely within the ridge structure 12 minimizes such variations and deviations, stabilizes the wavelength involved, and improves controllability of the laser device.

Second Embodiment

FIG. 3 through FIG. 19 depict the second embodiment of this invention in the form of a method for manufacturing an inventive distributed feedback semiconductor laser device. Specifically, FIGS. 3 through FIG. 19 illustrate the laser device of the first embodiment in FIGS. 1 and 2 as it is manufactured progressively in different processes of the manufacturing method implemented as the second embodiment.

Figure 3:
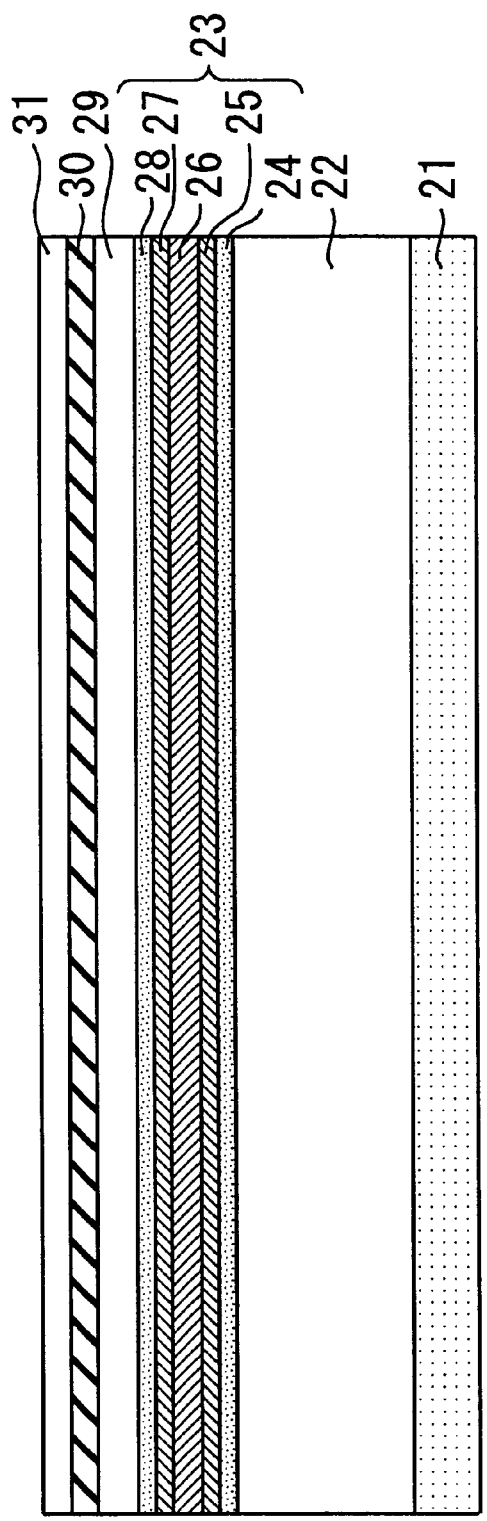
FIG. 3 is a cross-sectional view of the inventive distributed feedback laser device of FIG. 2 as manufactured in one process of a distributed feedback laser device manufacturing method implemented as a second embodiment of this invention.

In the process of FIG. 3, a semiconductor base 10 is formed illustratively by depositing on a semiconductor substrate 21 (i.e., starting material) an N-type InP clad layer 22, a composite layer 23, a P-type InP layer 29, a P-type InGaAsP layer 30, and a P-type InP layer 31 from the bottom up through MOCVD. The composite layer 23 comprises five layers 24 through 28. On each wafer in the above state, photolithographic alignment markers are etched.

Figure 4:
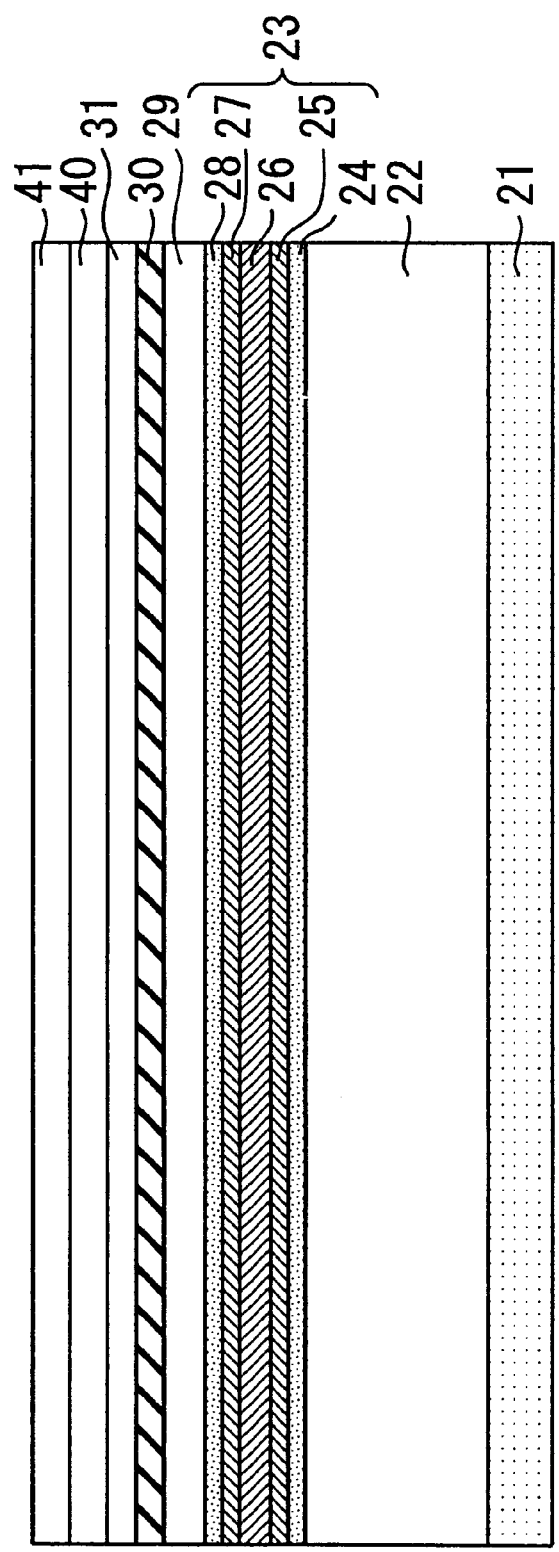
FIG. 4 is a cross-sectional view of the inventive distributed feedback laser device as manufactured in another process of the manufacturing method as the second embodiment.
Figure 5:
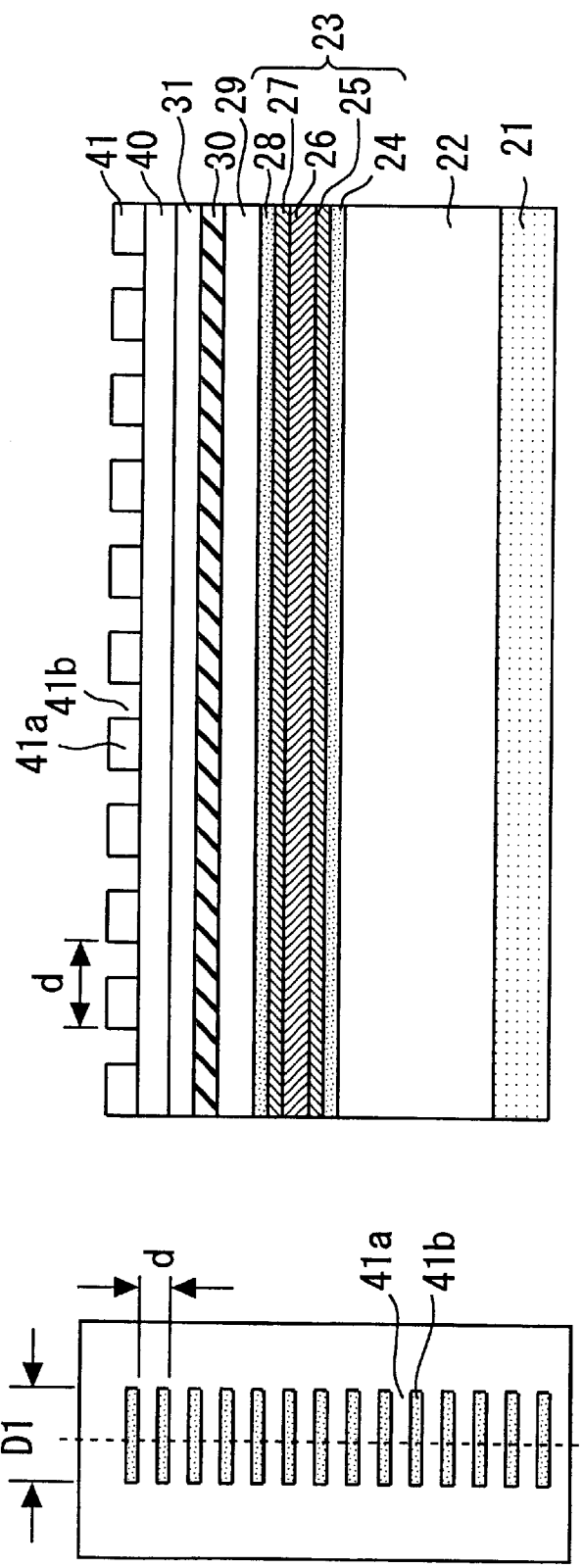
FIGS. 5A and 5B are a cross-sectional view and a top view of the inventive distributed feedback laser device as manufactured in another process of the manufacturing method as the second embodiment.

In the process of FIG. 4, an $SiO_2$ film 40 is formed on the P-type InP layer 31. A resist film 41 is formed on the $SiO_2$ film 40.

The next process is illustrated by FIGS. 5A and 5B. FIG. 5A on the right is a cross-sectional view taken along an optical axis 11 in the middle of the semiconductor base 10, and FIG. 5B on the left is a top view of the device being manufactured. In this process, the resist film 41 is exposed to light before being developed and patterned. The resist film 41 is patterned into numerous resist elements 41a arranged at pitches of "d" (2000 Å), each element having a width of D1 (10 μm). This constitutes the pattern by which to form a diffraction grating layer 30, with the resist elements 41a and hollow portions 41b of the resist film 41 arranged alternately along the optical axis 11. The width D1 is set for 10 μm because any width less than that dimension can produce irregularities in the formed pattern.

Figure 6:
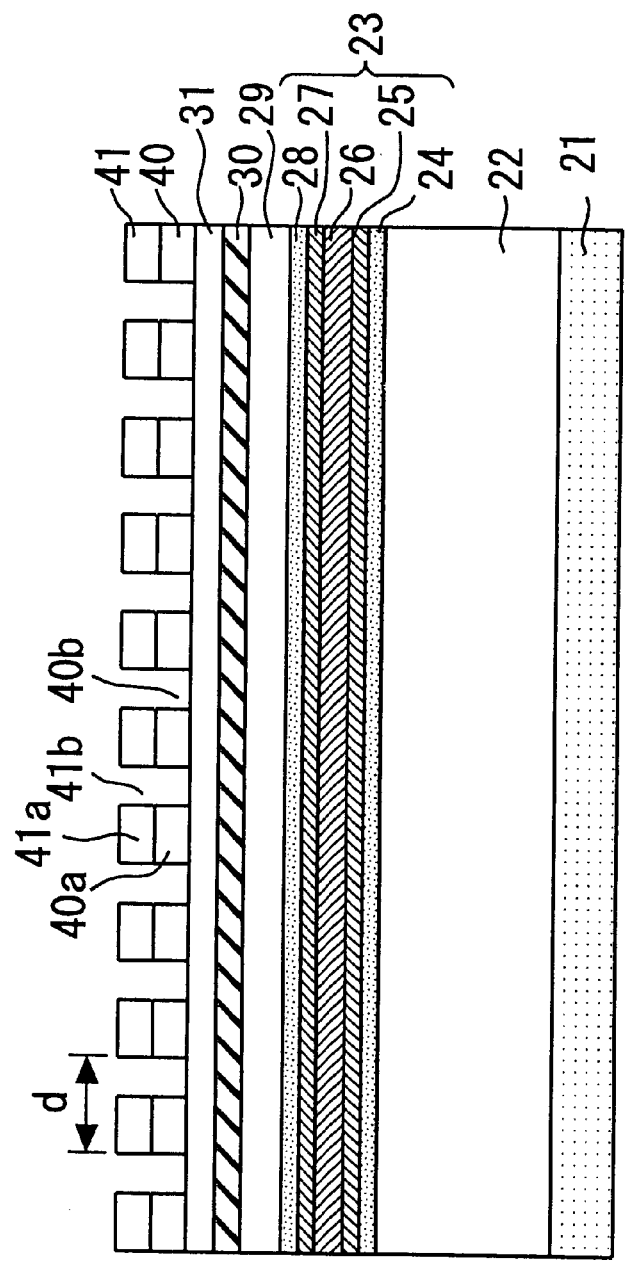
FIG. 6 is a cross-sectional view of the inventive distributed feedback laser device as manufactured in another process of the manufacturing method as the second embodiment.

FIG. 6 is a cross-sectional view also taken along the optical axis 11 in the middle of the semiconductor base 10. In this process, the $SiO_2$ film 40 is subjected to dry etching with the patterned resist film 41 used as a mask. This process forms $SiO_2$ film elements 40a and hollow portions 40b of the $SiO_2$ film 40 arranged alternately as in the case of the resist film 41. In the next process shown FIG. 7, the resist film 41 is removed.

FIG. 8A on the right is a cross-sectional view taken along a plane perpendicular to the optical axis 11, and FIG. 8B on the left is a top view of the device being manufactured. In this process, a new resist film 42 is furnished on the $SiO_2$ film 40. The resist film 42 is subjected to photolithography by stepper in reference to the markers formed earlier in the process of FIG. 3, whereby a slit 42a is formed through the resist film 42. The slit 42a having a width D (1.8 μm) is formed in the middle of the upper surface of the wafer. The slit 42a is overlaid with the dispersed $SiO_2$ film elements 40a.

Figure 9A:
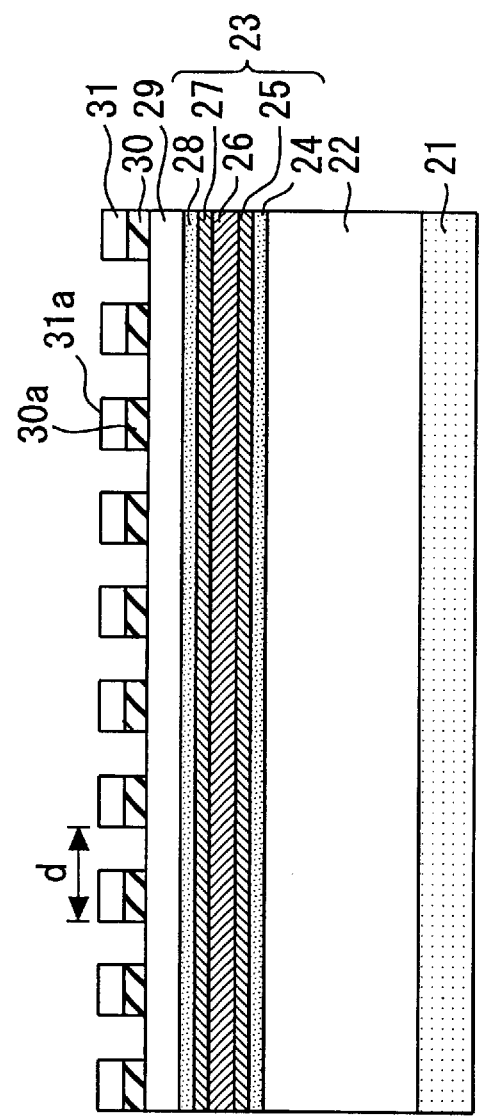
FIGS. 9A and 9B are a cross-sectional view and a top view of the inventive distributed feedback laser device as manufactured in another process of the manufacturing method as the second embodiment.
Figure 9B:
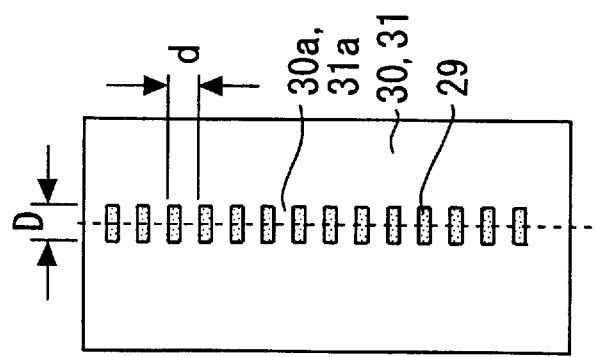

FIG. 9A on the right is a cross-sectional view taken along the optical axis 11 in the middle of the semiconductor base 10, and FIG. 9B on the left is a top view of the device being manufactured. In this process, the P-type InP layer 31 and P-type InGaAsP layer 30 are subjected to dry etching with the resist film 42 and $SiO_2$ film 40 used as masks. Those portions of the layers 31 and 30 where the resist film 42 and $SiO_2$ film 40 do not exist are removed. The process forms, in the P-type InP layer 31 and P-type InGaAsP layer 30, a plurality of grating elements 31a and 30a at pitches "d" along the optical axis 11, each element having the width D. FIGS. 9A and 9B show the state in effect when the resist film 42 and $SiO_2$ film 40 are removed following the dry etching.

Figure 10:
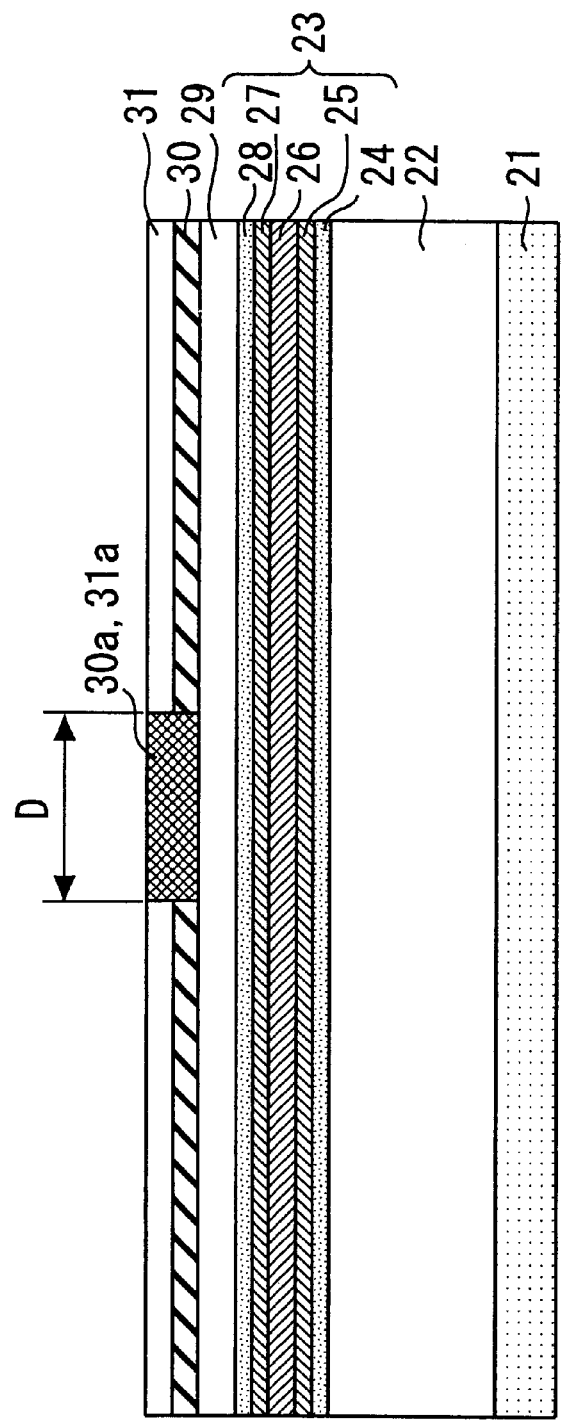
FIG. 10 is a cross-sectional view of the inventive distributed feedback laser device as manufactured in another process of the manufacturing method as the second embodiment.

FIG. 10 is a cross-sectional view taken on a plane perpendicular to the optical axis 11 of the semiconductor base 10 depicted in FIGS. 9A and 9B. In FIG. 10, the grating elements 31a and 30a are shown hatched for emphasis, each element having the width D.

Figure 11:
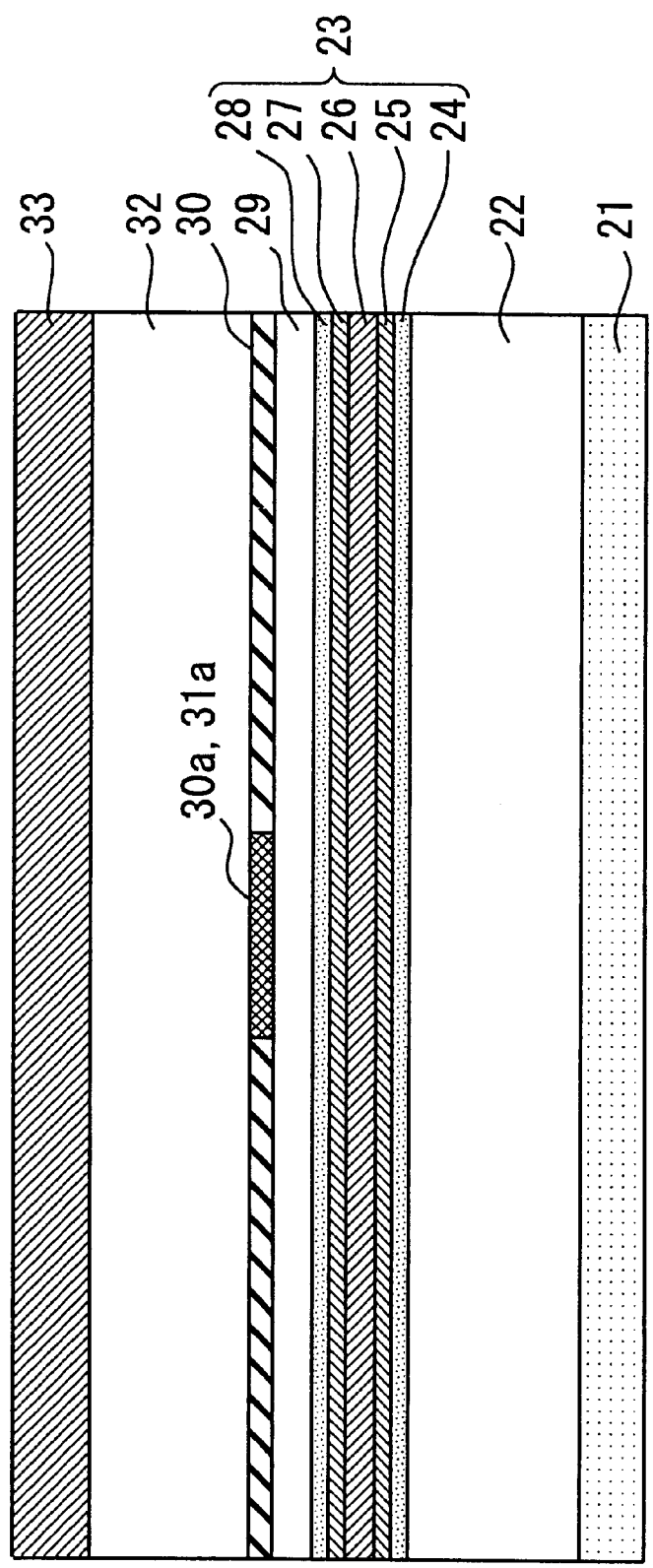
FIG. 11 is a cross-sectional view of the inventive distributed feedback laser device as manufactured in another process of the manufacturing method as the second embodiment.

As with FIG. 10, FIG. 11 is a cross-sectional view taken on a plane perpendicular to the optical axis 11 of the semiconductor base 10. In this process, the layers 31 and 30 of FIG. 10 are covered entirely with a P-type InP layer 32. On the P-type InP layer 32, a P-type InGaAs contact layer 33 is formed through buried growth. Before the layers 32 and 33 are formed in this process, the markers formed in the process of FIG. 3 should be covered with an $SiO_2$ film. The covering allows the same markers to be used continuously up to the last process, whereby mask misalignment is minimized in all photolithographic processes.

Figure 12:
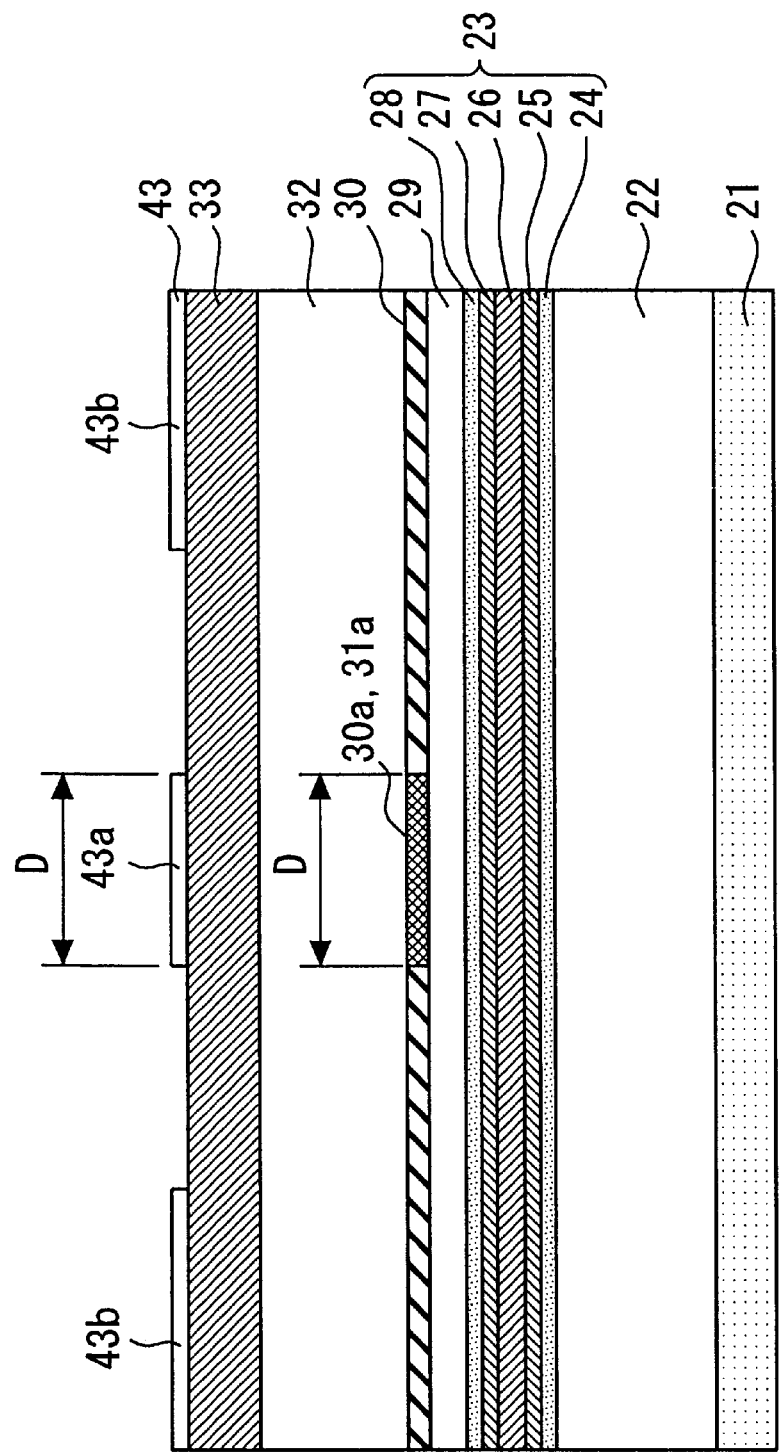
FIG. 12 is a cross-sectional view of the inventive distributed feedback laser device as manufactured in another process of the manufacturing method as the second embodiment.

FIG. 12, as with FIG. 11, is a cross-sectional view taken on a plane perpendicular to the optical axis 11 of the semiconductor base 10. In this process, an $SiO_2$ film 43 is formed on the contact layer 33. The $SiO_2$ film 43 is patterned into a middle element 43a and side elements 43b. The middle element 43a, used to constitute subsequently a ridge structure 12, is formed in the middle of the semiconductor base 10 in the location where the ridge structure 12 is supposed to be provided. The element 43a has the width D. The side elements 43b are used eventually to constitute side walls 14. A gap between the middle element 43a and each side element 43b corresponds to a groove 13.

Figure 13:
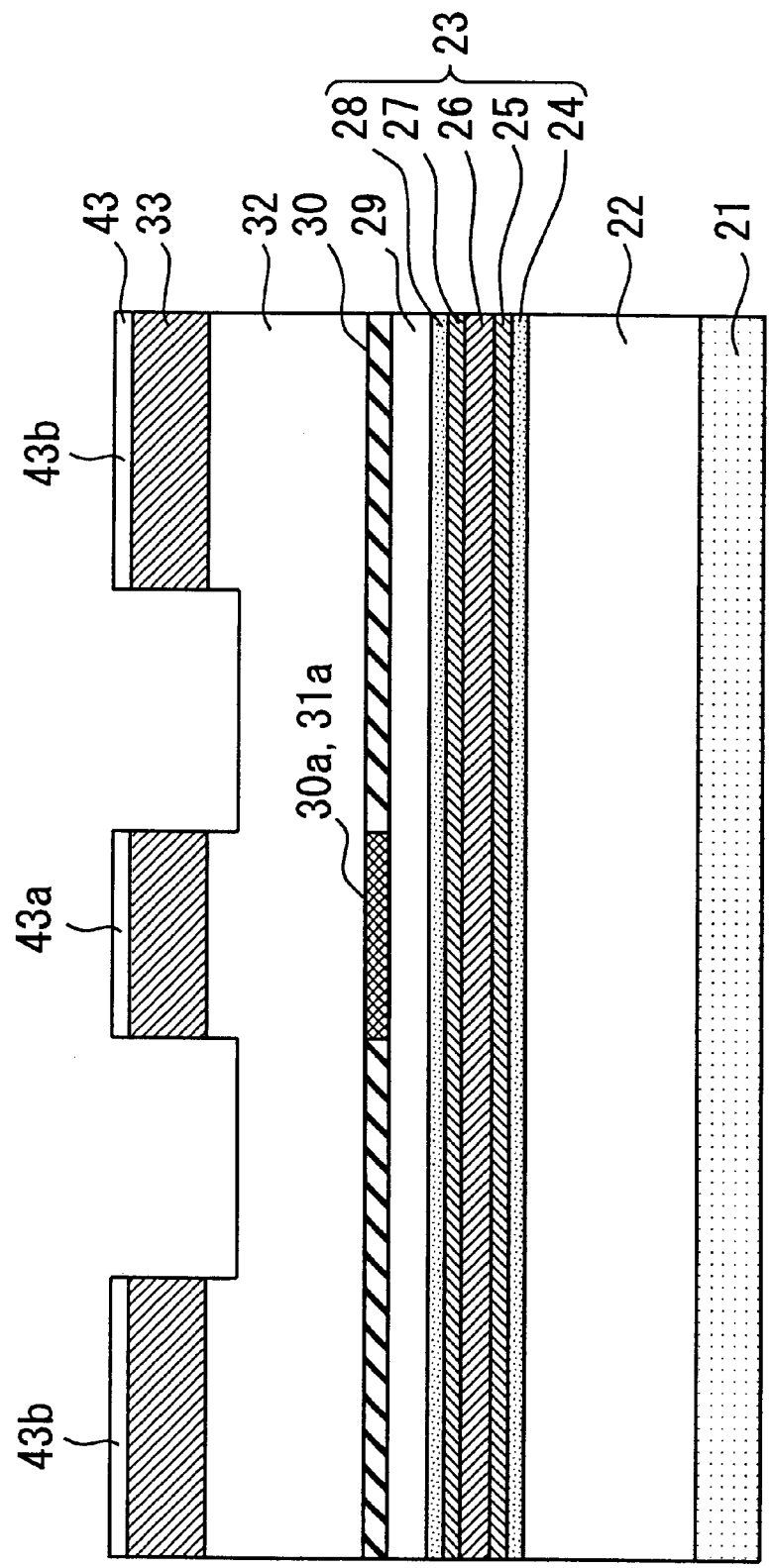
FIG. 13 is a cross-sectional view of the inventive distributed feedback laser device as manufactured in another process of the manufacturing method as the second embodiment.

FIG. 13, as with FIG. 12, is a cross-sectional view taken on a plane perpendicular to the optical axis 11 of the semiconductor base 10. In this process, dry etching is performed with the $SiO_2$ film 43 used as a mask. The dry etching cuts partially into the thickness of the P-type InP layer 32, thus cutting off the P-type InGaAs contact layer 33.

Figure 14:
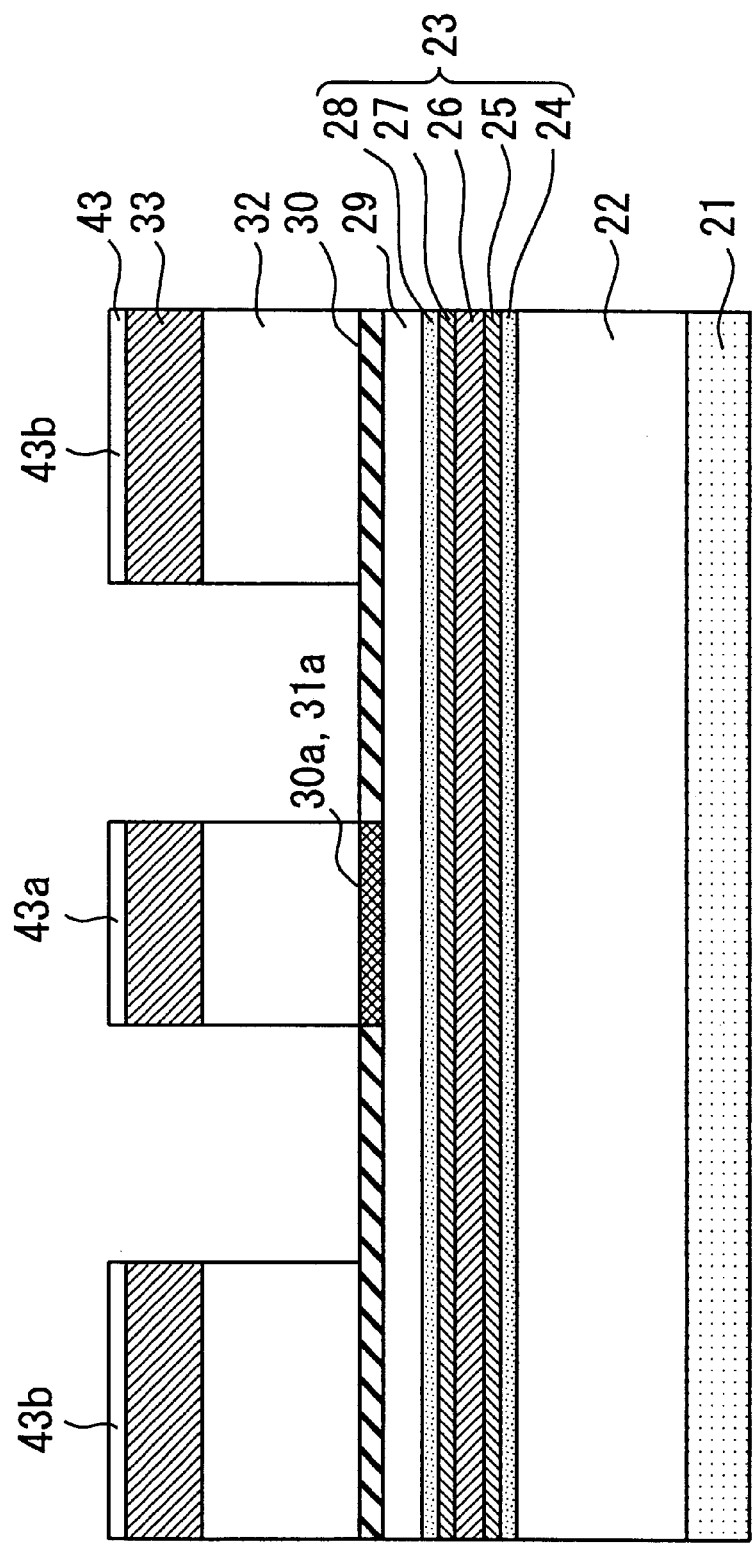
FIG. 14 is a cross-sectional view of the inventive distributed feedback laser device as manufactured in another process of the manufacturing method as the second embodiment.

FIG. 14, as with FIG. 13, is a cross-sectional view taken on a plane perpendicular to the optical axis 11 of the semiconductor base 10. The dry etching in FIG. 13 is followed in this process by wet etching carried out with the $SiO_2$ film 43 used as a mask. The P-type InP layer 32 is completely etched through and separated. The wet etching is stopped just when the P-type InGaAsP layer 30 is exposed. The etch selectivity is contingent on the use of a specific wet etching solution. Illustratively, if the solution is a mixture of one part of hydrochloric acid and two parts of phosphoric acid, the degree of etch selectivity is enhanced between the InP layer 32 and the InGaAsP layer 30. That is, the etch rate with respect to the InP layer 32 is significantly higher than the rate regarding the InGaAsP layer 30. This makes it possible to stop the etching just when the InGaAsP layer 30 is exposed. Because the mixed solution of hydrochloric acid and phosphoric acid promotes etching primarily downward and scarcely in the lateral direction, the etching process forms a ridge structure 12 having vertical sides.

Figure 15:
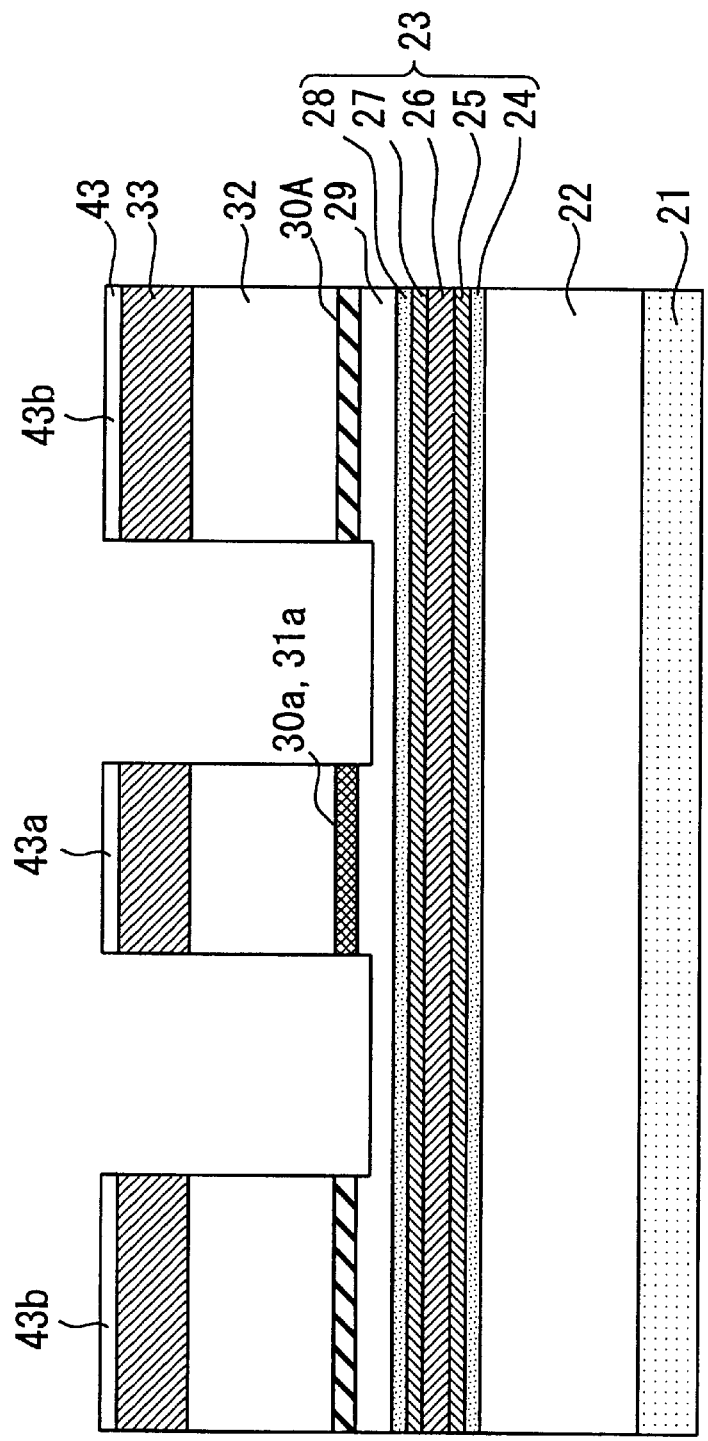
FIG. 15 is a cross-sectional view of the inventive distributed feedback laser device as manufactured in another process of the manufacturing method as the second embodiment.

FIG. 15 is a cross-sectional view taken on a plane perpendicular to the optical axis 11 of the semiconductor base 10. This process involves further performing dry etching with the $SiO_2$ film 43 used as a mask, cutting through the P-type InGaAsP layer 30 and partially into the P-type InP layer 29. The InGaAsP layer 30 is cut into the diffraction grating layer 30 inside the ridge structure 12 and the layer 30A within the side walls 14. The grating elements 31a over the grating elements 30a and the layer 31 over the layer 30A are the same composition as the P-type InP layer 32 overlaid and are shown included in the layer 32 in FIG. 15.

Figure 16:
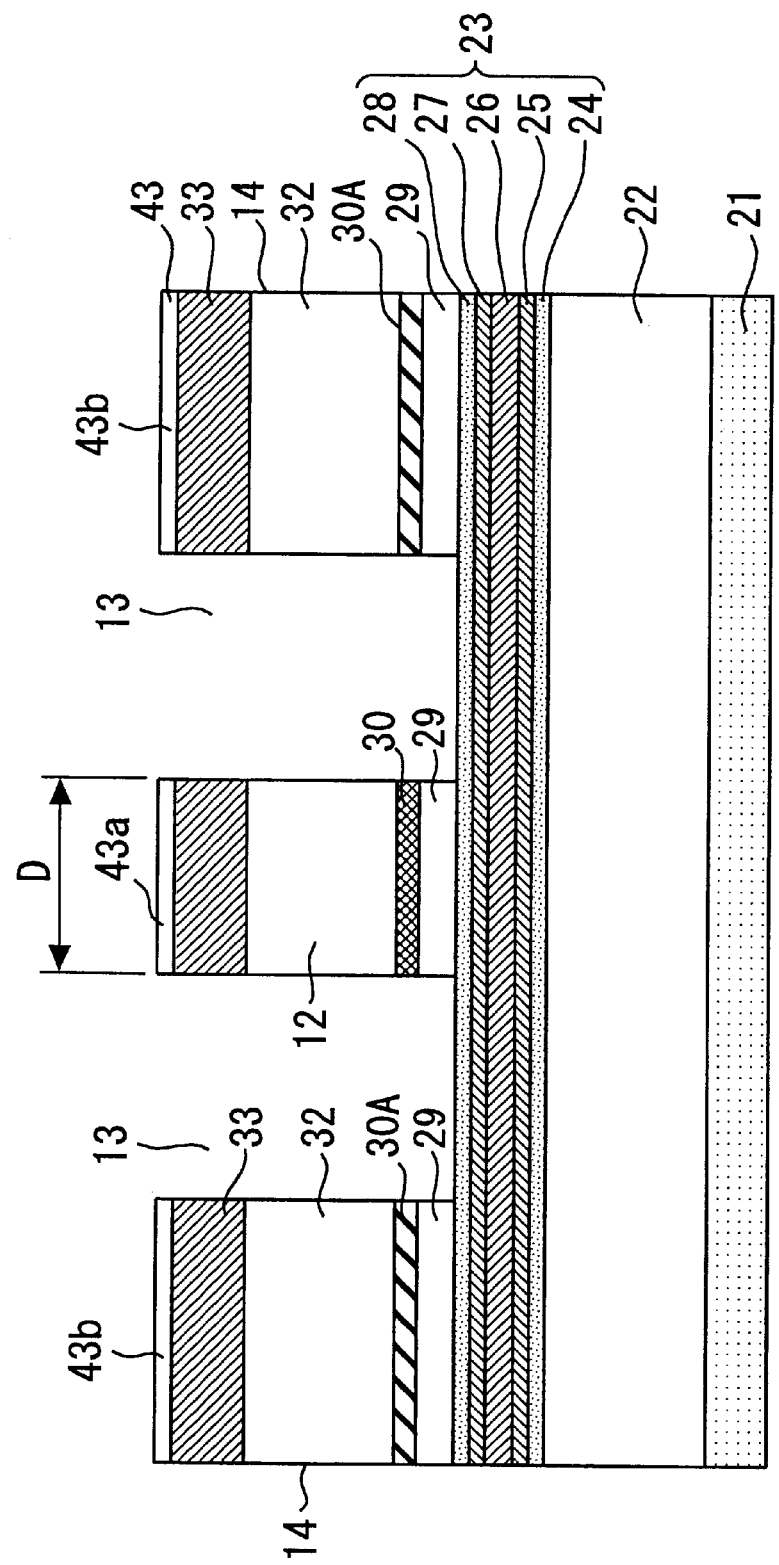
FIG. 16 is a cross-sectional view of the inventive distributed feedback laser device as manufactured in another process of the manufacturing method as the second embodiment.

FIG. 16 is a cross-sectional view taken on a plane perpendicular to the optical axis 11 of the semiconductor base 10. This process involves carrying out wet etching following the dry etching of FIG. 15. The etching cuts through the P-type InP layer 29 and stops just when the P-type AlInAs layer 28 is exposed. As a result, the ridge structure 12 is formed in the middle of the semiconductor base 10 and the side walls 14 are formed on both sides of the ridge with the groove 13 located between the ridge and each side wall. The layers 29, 30, 31, 32 and 33 are cut off by the grooves 13. In particular, the layer 30 is differentiated as a layer inside the ridge structure 12, and the cut-off layer 30A as a layer within the side walls 14. The wet etching solution is illustratively a mixture of hydrochloric acid (1 part) and phosphoric acid (2 parts). With this etching solution in use, the etch rate with respect to the AlInAs layer 28 is smaller than the rate regarding the InP layer 29. However, the AlInAs layer 28 is slightly etched as well. Thus the etching time is to be determined by taking the etch rate into consideration.

The width of the ridge structure 12 is dependent on the width D of the middle element 43a of the $SiO_2$ film 43. In this case, the width of the middle element 43a is set so as to be the same as the width D of the diffraction grating layer 30. It follows that if the center line of the middle element 43a is aligned with the center line of the diffraction grating layer 30 and if the width D of the grating layer 30 is overlaid precisely with the middle element 43a, then the grating elements 30a of the diffraction grating layer 30 are accommodated inside the width D of the ridge structure 12. In other words, the diffraction grating 30 may be formed in a manner being confined exactly within the width D of the ridge structure 12.

Figure 17:
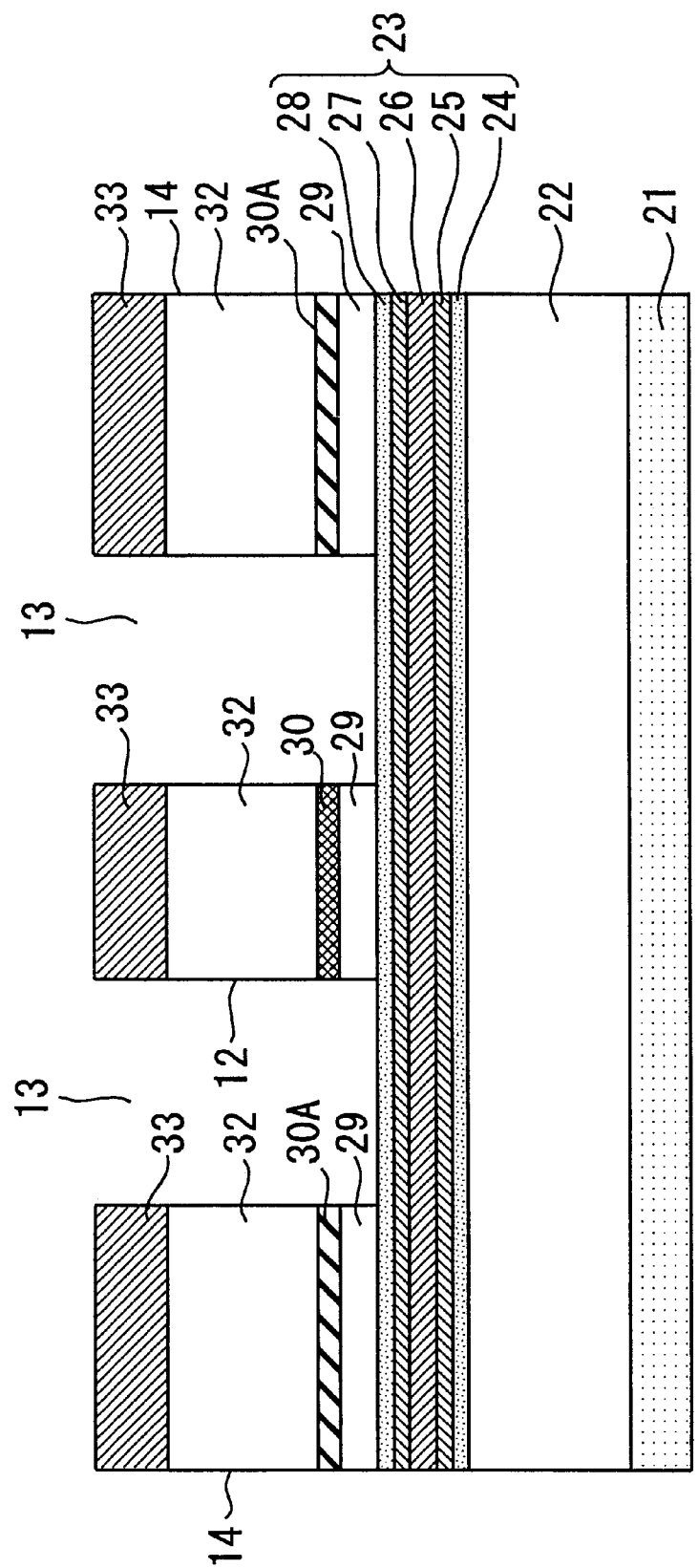
FIG. 17 is a cross-sectional view of the inventive distributed feedback laser device as manufactured in another process of the manufacturing method as the second embodiment.
Figure 18:
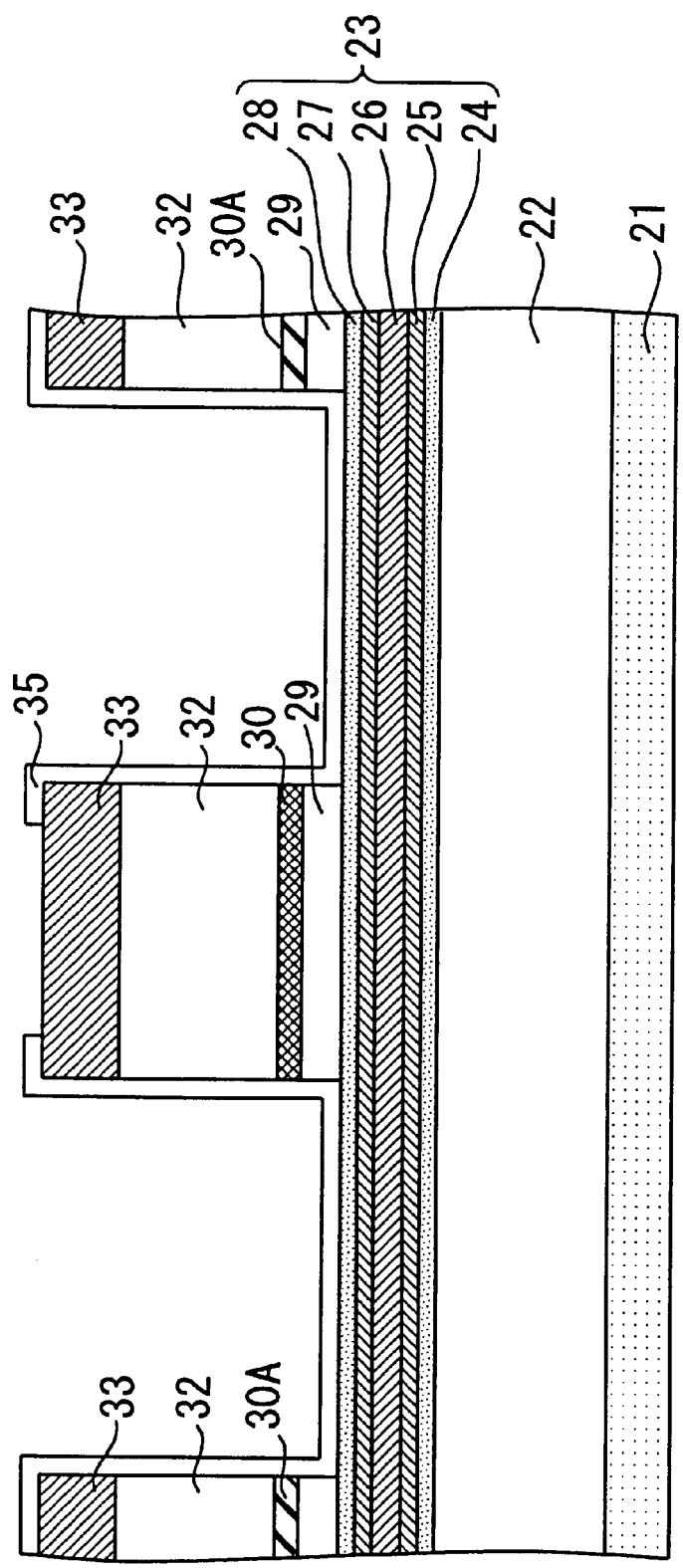
FIG. 18 is a cross-sectional view of the inventive distributed feedback laser device as manufactured in another process of the manufacturing method as the second embodiment.
Figure 19:
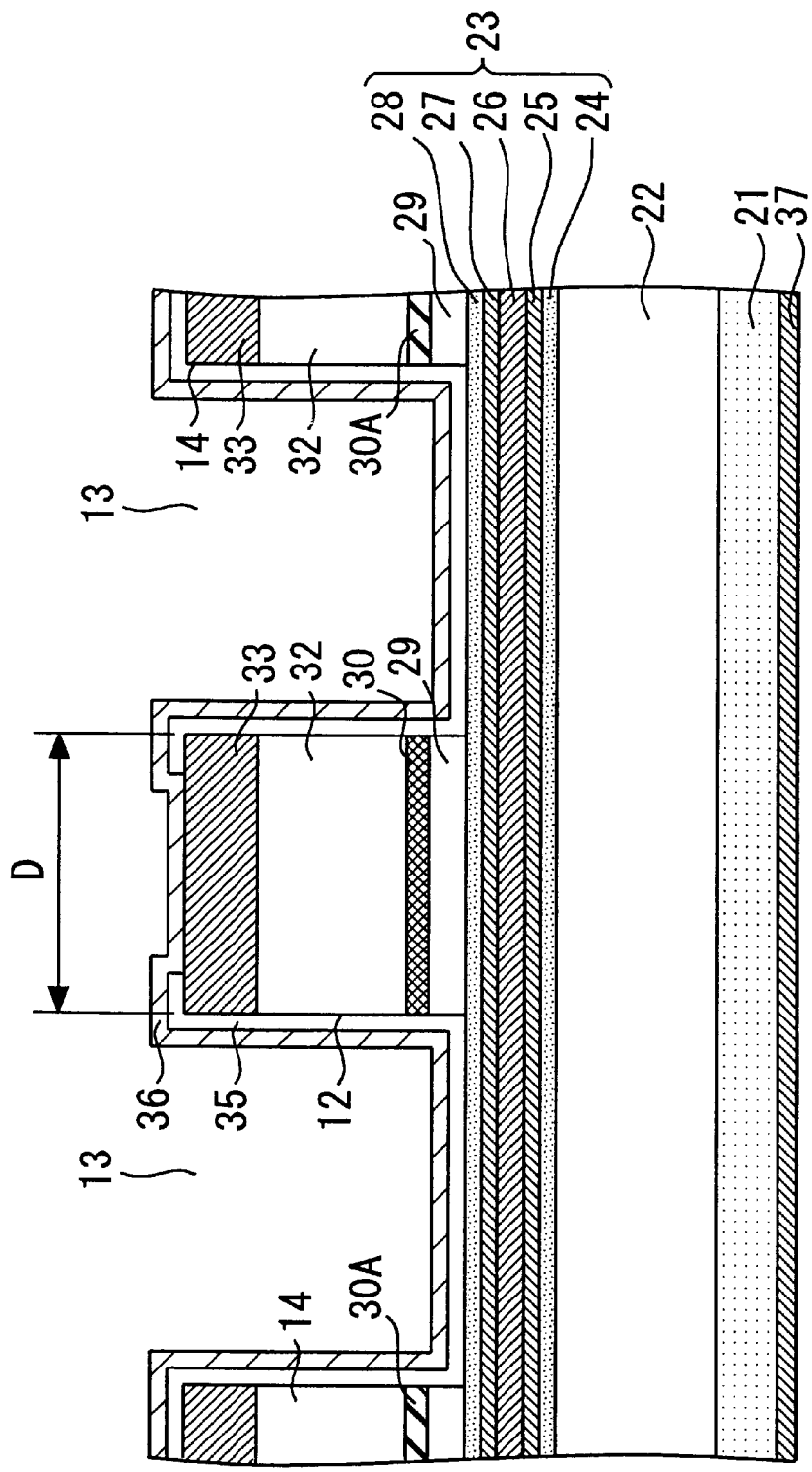
FIG. 19 is a cross-sectional view of the inventive distributed feedback laser device as manufactured in another process of the manufacturing method as the second embodiment.

FIGS. 17, 18 and 19 are each a cross-sectional view taken on a plane perpendicular to the optical axis 11 of the semiconductor base 10. The process of FIG. 17 removes the $SiO_2$ film 43. In the process of FIG. 18, a new $SiO_2$ film 35 is furnished over the entire surface before being selectively perforated at the top of the ridge structure 12. In the process of FIG. 19, a P-type electrode 36 is formed on the $SiO_2$ film 35 and is brought into contact through the latter's openings with the contact layer 33 of the ridge structure 12. An N-type electrode 37 is formed over the lower principal plane 10b of the semiconductor base 10.

In the processes of FIGS. 8A, 8B, 9A and 9B, what is important is the use as etching masks of the plurality of film elements 40a of the $SiO_2$ film 40, each element having a width D1 greater than the width D, as well as the resist film 42 having the slit 42a as wide as D and centered inside the width D1. The arrangement makes it possible to establish the width D and pitch "d" of the grating elements 30a precisely and in a well-controlled manner, whereby the diffraction grating layer 30 is formed strictly inside the ridge structure 12.

The markers formed in the process of FIG. 3 are also used for alignment in patterning both the resist film 42 with which to form the diffraction grating layer 30 and the $SiO_2$ film elements 43a with which to form the ridge structure 12. The markers contribute to improving the alignment accuracy of the parts involved and confining the diffraction grating layer 30 precisely within the ridge structure 12.

What is important in the process of FIG. 14 is that the layer 30 functions as an etching stopper. As illustrated in FIG. 14, the wet etching when carried out cuts through the P-type InP layer 33 and stops at the layer 30. When the wet etching solution is a mixture of hydrochloric acid (1 part) and phosphoric acid (2 parts), the etch rate with respect to the InP layer 33 is significantly higher than the rate regarding the InGaAsP layer 30. The use of that etching solution stops the progress of wet etching at the layer 30. This in turn helps better control subsequent processes wherein the etching is performed through the layers 30 and 29 and stopped at the layer 28.

Third Embodiment

Figure 20:
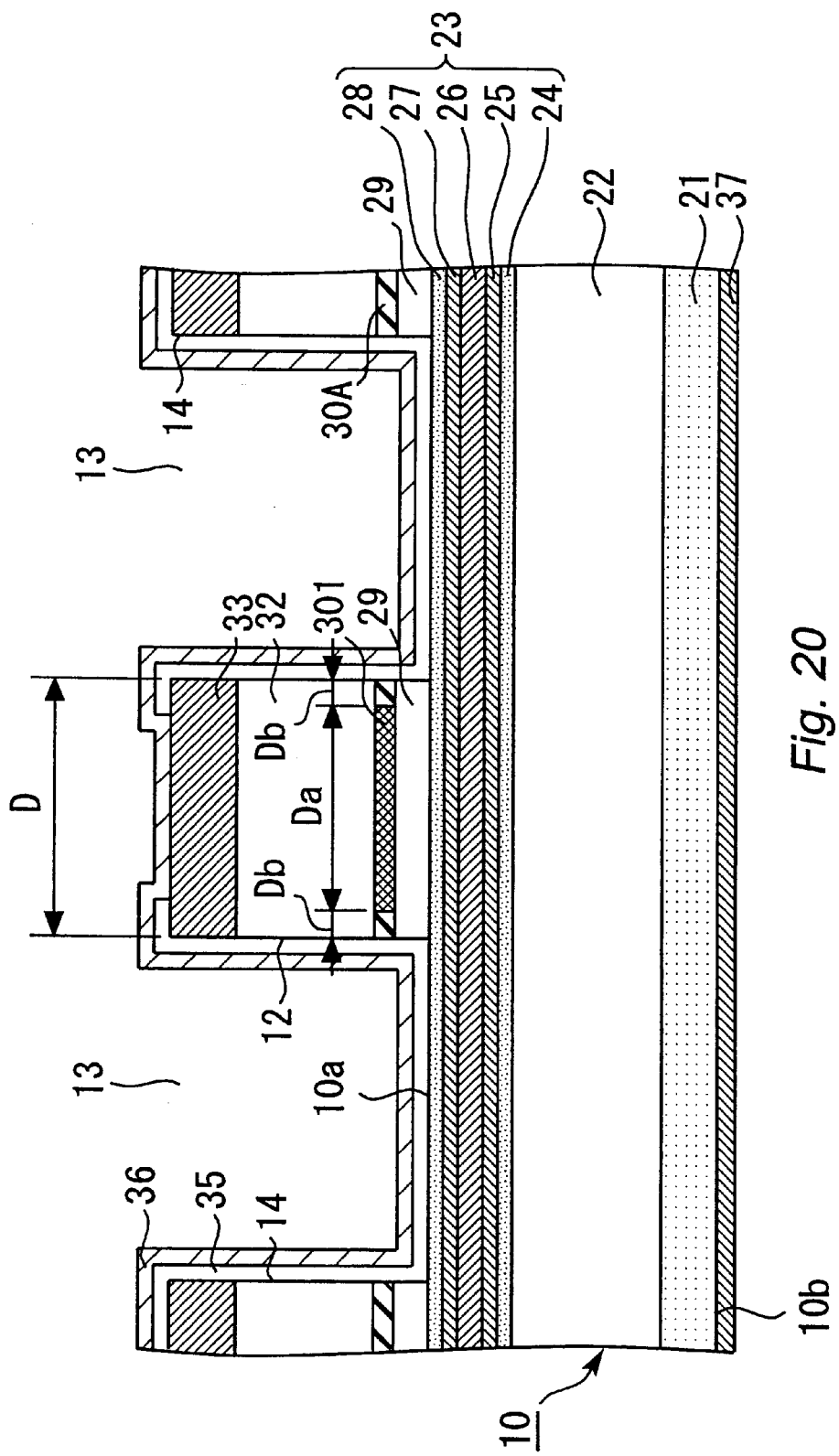
FIG. 20 is a cross-sectional view of a distributed feedback laser device practiced as a third embodiment of this invention.
Figure 21:
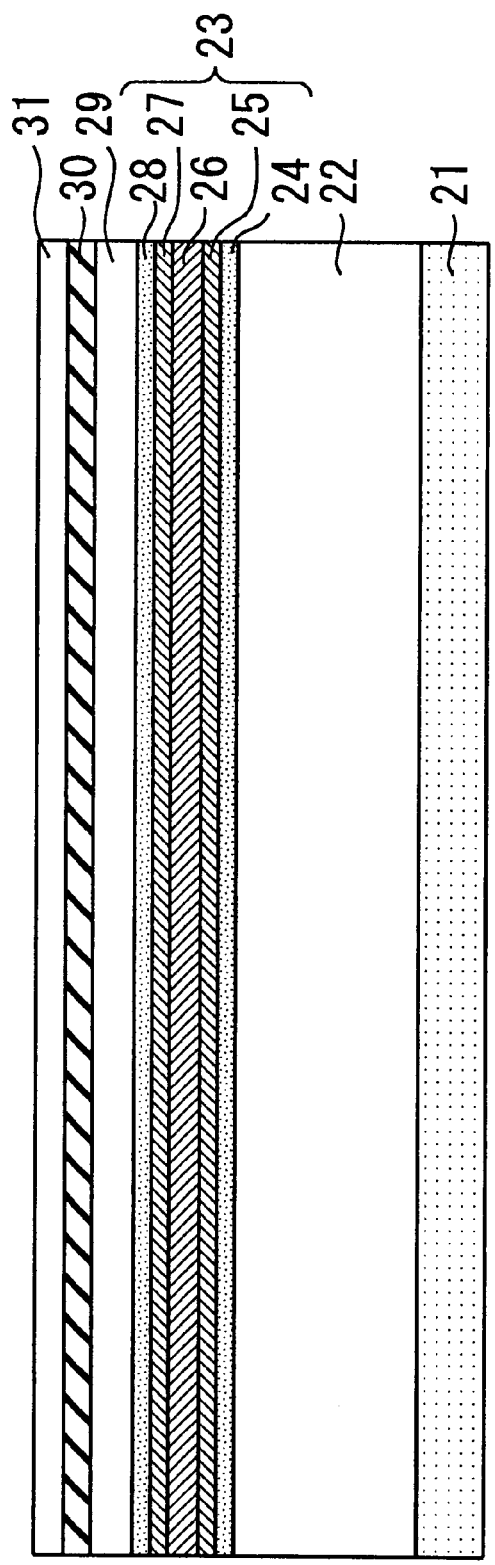
FIG. 21 is a cross-sectional view of the inventive distributed feedback laser device of FIG. 20 as manufactured in one process of a distributed feedback laser device manufacturing method implemented as a fourth embodiment of this invention.
Figure 22:
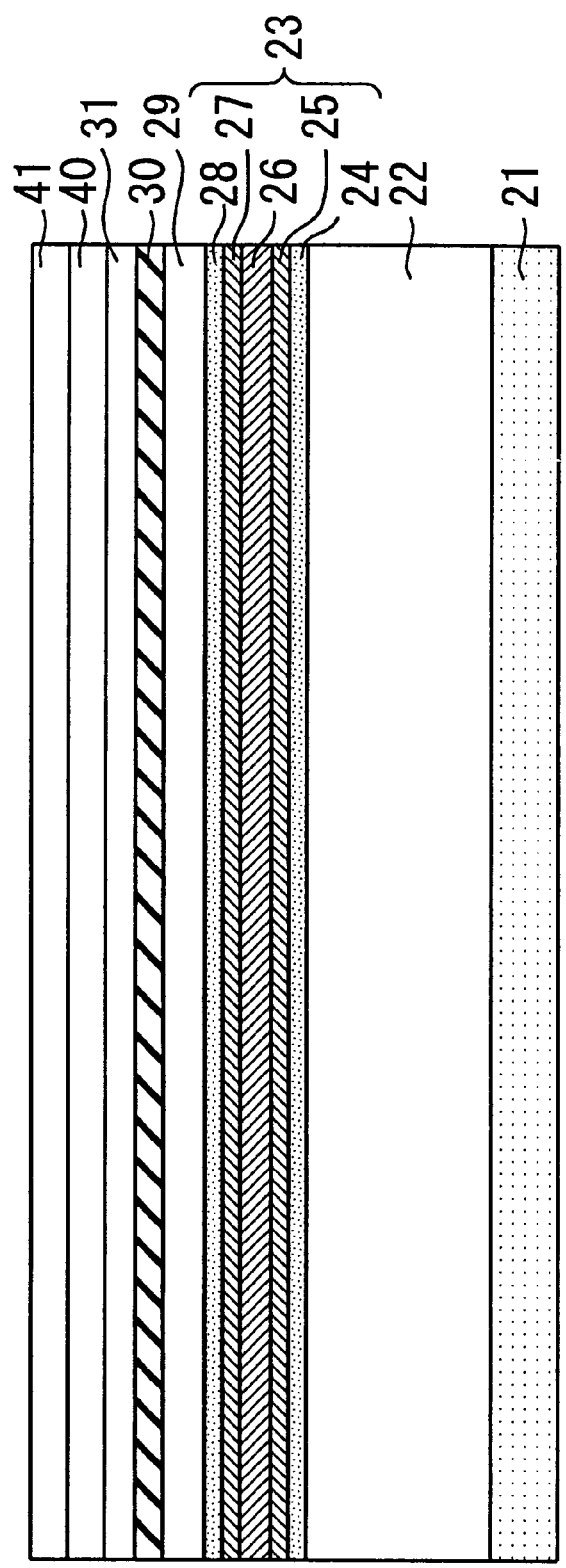
FIG. 22 is a cross-sectional view of the inventive distributed feedback laser device as manufactured in another process of the manufacturing method as the fourth embodiment.

FIG. 20 is a cross-sectional view of a distributed feedback laser device practiced as the third embodiment of this invention. As with the setup of FIG. 1, the third embodiment centers structurally on a semiconductor base 10. FIG. 20, as with FIG. 19, is a cross-sectional view taken on a plane perpendicular to the optical axis 11 of the semiconductor base 10. The third embodiment is characterized by a diffraction grating layer 301 having a width Da that is less than the width D of the ridge structure 12. Because Da is narrower than D, there exists a distance Db between the diffraction grating layer 301 and each side of the ridge structure 12. In regions formed by the distance Db exists a P-type InGaAsP layer 30 with no grating elements 30a formed therein. The other structural features of the third embodiment are the same as those of the first embodiment.

Fourth Embodiment

FIGS. 21 through 36 depict the fourth embodiment of this invention in the form of a method for manufacturing an inventive distributed feedback semiconductor laser device. Specifically, these figures illustrate the laser device of the third embodiment in FIG. 20 as it is manufactured progressively in different processes of the manufacturing method implemented as the fourth embodiment.

The processes of FIGS. 21 through 25 are the same as those of FIGS. 3 through 7.

FIG. 26A on the right is a cross-sectional view taken on a plane perpendicular to the optical axis 11, and FIG. 26B on the left is a top view of the device being manufactured. In this process, a new resist film 42 is furnished on the $SiO_2$ film 40. The resist film 42 is subjected to photolithography by stepper in reference to the markers formed earlier in the process of FIG. 21, whereby a slit 42b is formed through the resist film 42. The slit 42b is an opening with which to form a diffraction grating layer 301, the slit having a width Da (1.6 μm) less than the width D (1.8 μm) and formed in the middle of the upper surface of the wafer. The slit 42b is overlaid with the dispersed $SiO_2$ film elements 40a.

FIG. 27A on the right is a cross-sectional view taken along the optical axis 11 in the middle of the semiconductor base 10, and FIG. 27B on the left is a top view of the device being manufactured. In this process, the P-type InP layer 31 and P-type InGaAsP layer 30 are subjected to dry etching with the resist film 42 and SiO$_2$ film 40 used as masks. Those portions of the layers 31 and 30 where the resist film 42 and SiO$_2$ film 40 do not exist are removed. The process forms, in the P-type InP layer 31 and P-type InGaAsP layer 30, a plurality of grating elements 31a and 30a at pitches "d" along the optical axis 11, each element having the width Da. FIGS. 27A and 27B show the state in effect when the resist film 42 and SiO$_2$ film 40 are removed following the dry etching.

Figure 28:
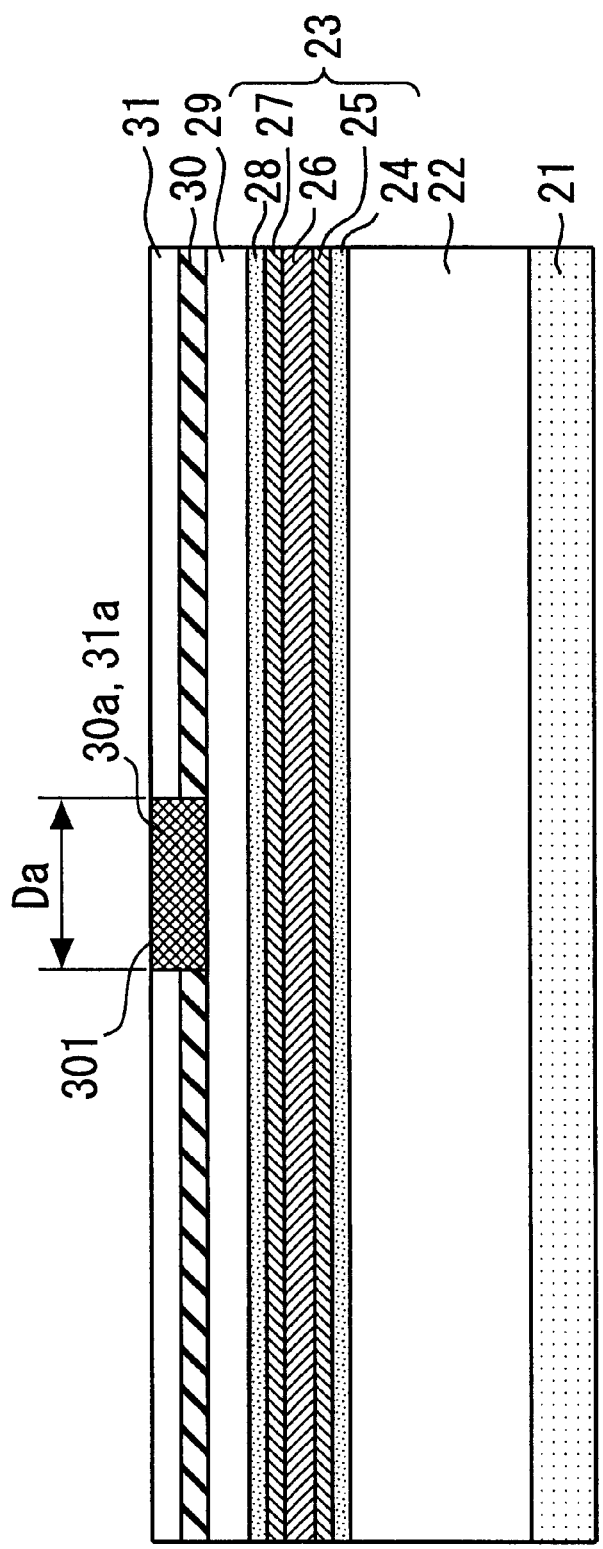
FIG. 28 is a cross-sectional view of the inventive distributed feedback laser device as manufactured in another process of the manufacturing method as the fourth embodiment.

FIG. 28 is a cross-sectional view taken on a plane perpendicular to the optical axis 11 of the semiconductor base 10. In FIG. 28, the grating elements 31a and 30a are shown hatched for emphasis, each element having the width Da.

Figure 29:
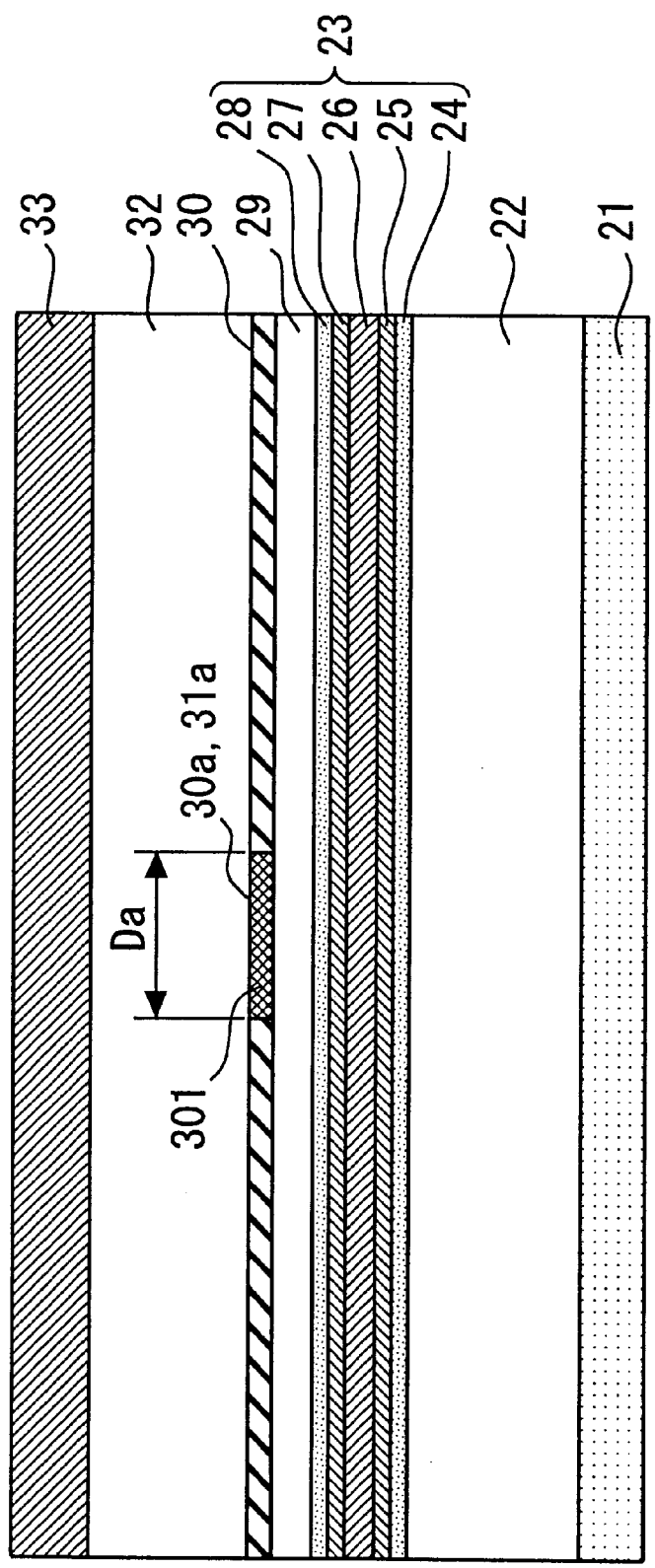
FIG. 29 is a cross-sectional view of the inventive distributed feedback laser device as manufactured in another process of the manufacturing method as the fourth embodiment.

As with FIG. 28, FIG. 29 is a cross-sectional view taken on a plane perpendicular to the optical axis 11 of the semiconductor base 10. In this process, the layers 31 and 30 of FIG. 28 are covered entirely with a P-type InP layer 32. On the P-type InP layer 32, a P-type InGaAs contact layer 33 is formed through buried growth. Before the layers 32 and 33 are formed in this process, the markers formed in the process of FIG. 21 should be covered with an SiO$_2$ film. The covering allows the same markers to be used continuously up to the last process, whereby mask misalignment is minimized in all photolithographic processes.

Figure 30:
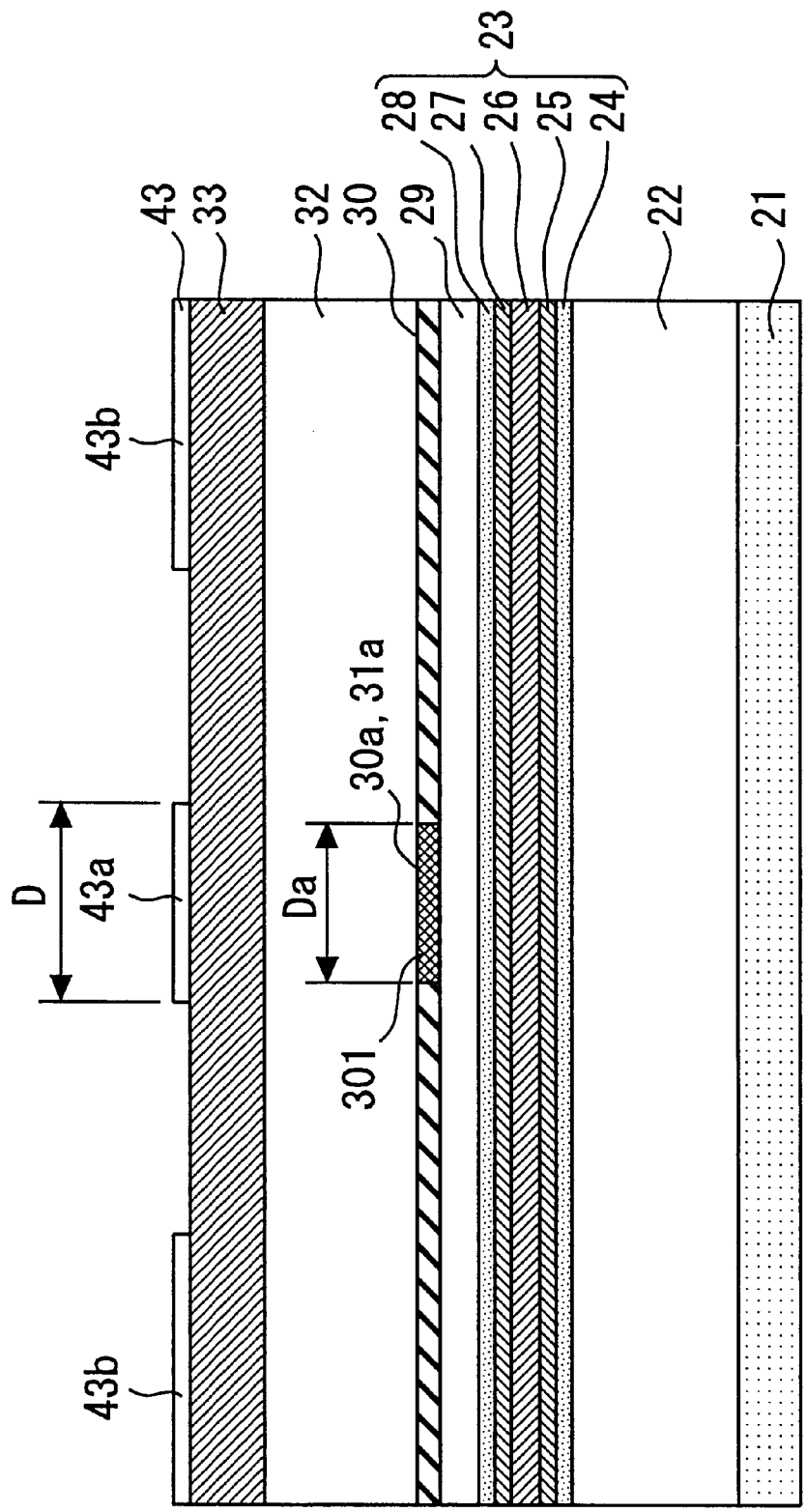
FIG. 30 is a cross-sectional view of the inventive distributed feedback laser device as manufactured in another process of the manufacturing method as the fourth embodiment.

FIG. 30, as with FIG. 29, is a cross-sectional view taken on a plane perpendicular to the optical axis 11 of the semiconductor base 10. In this process, an SiO$_2$ film 43 is formed over the contact layer 33. The SiO$_2$ film 43 is patterned into a middle element 43a and side elements 43b. The middle element 43a, used to constitute subsequently a ridge structure 12, is formed in the middle of the semiconductor base 10 in the location where the ridge structure 12 is supposed to be provided. The element 43a is given the width D. The side elements 43b are used eventually to constitute side walls 14. A gap between the middle element 43a and each side element 43b corresponds to a groove 13.

Figure 31:
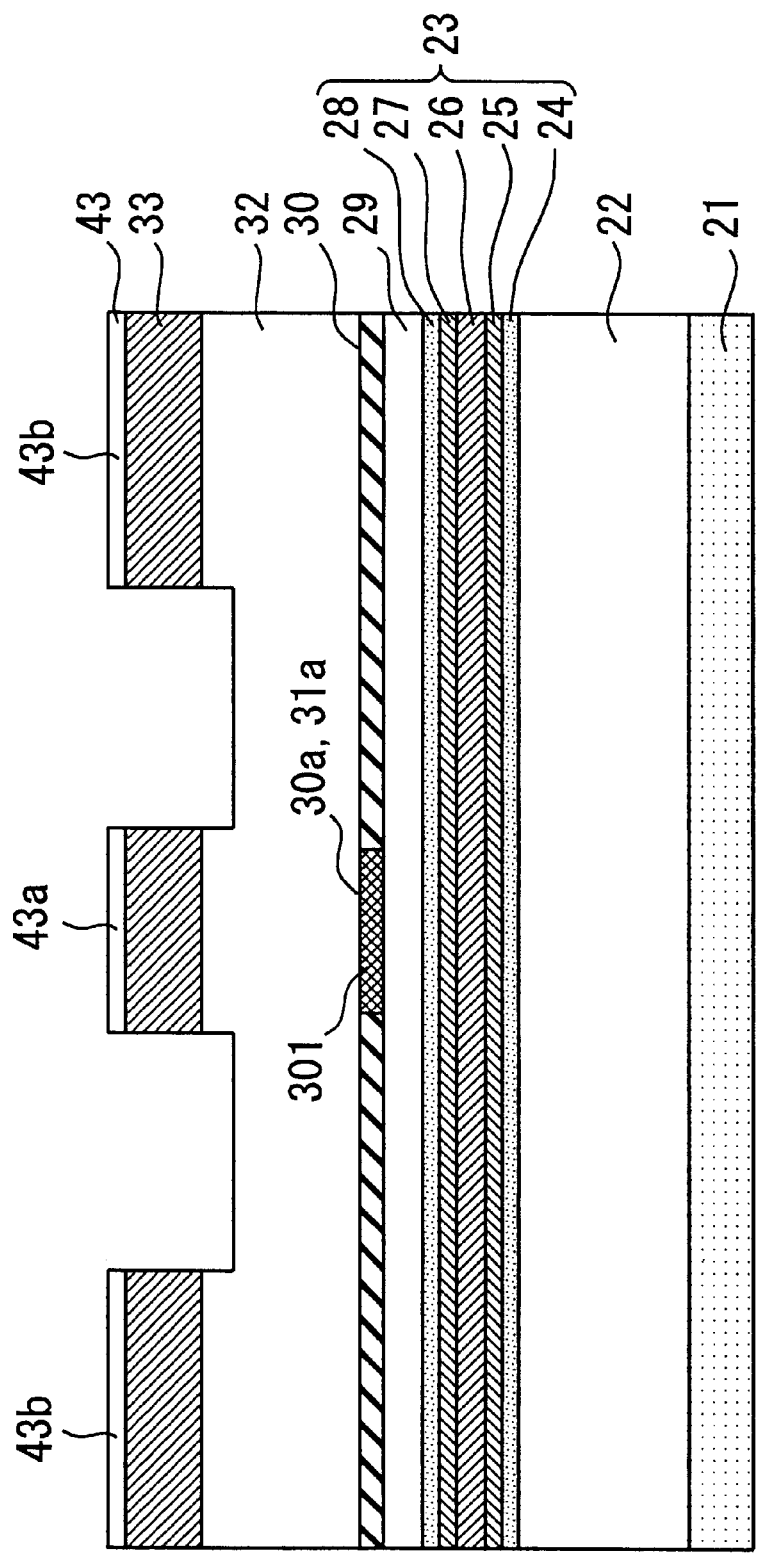
FIG. 31 is a cross-sectional view of the inventive distributed feedback laser device as manufactured in another process of the manufacturing method as the fourth embodiment.

FIG. 31, as with FIG. 30, is a cross-sectional view taken on a plane perpendicular to the optical axis 11 of the semiconductor base 10. In this process, dry etching is performed with the SiO$_2$ film 43 used as a mask. The dry etching cuts partially into the thickness of the P-type InP layer 32, thus cutting off the P-type InGaAs contact layer 33.

Figure 32:
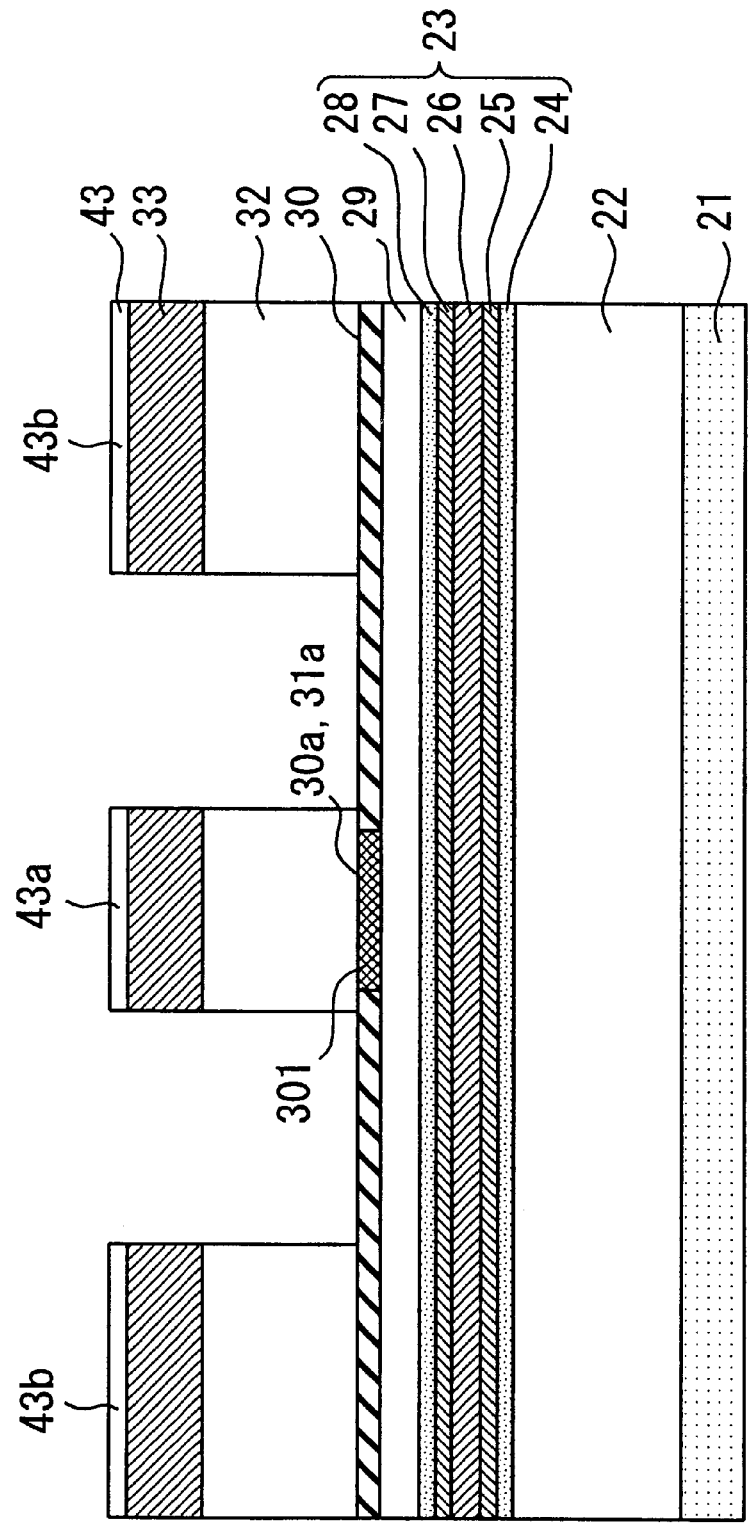
FIG. 32 is a cross-sectional view of the inventive distributed feedback laser device as manufactured in another process of the manufacturing method as the fourth embodiment.

FIG. 32, as with FIG. 31, is a cross-sectional view taken on a plane perpendicular to the optical axis 11 of the semiconductor base 10. The dry etching in FIG. 31 is followed in this process by wet etching carried out with the SiO$_2$ film 43 used as a mask. The P-type InP layer 32 is completely etched through and separated. The wet etching is stopped just when the P-type InGaAsP layer 30 is exposed. The etch selectivity is contingent on the use of a specific wet etching solution. Illustratively, if the solution is a mixture of one part of hydrochloric acid and two parts of phosphoric acid, the degree of etch selectivity is enhanced between the InP layer 32 and the InGaAsP layer 30. That is, the etch rate with respect to the InP layer 32 is significantly higher than the rate regarding the InGaAsP layer 30. This makes it possible to stop the etching just when the InGaAsP layer 30 is exposed. Because the mixed solution of hydrochloric acid and phosphoric acid promotes etching primarily downward and scarcely in the lateral direction, the etching process forms a ridge structure 12 having vertical sides.

Figure 33:
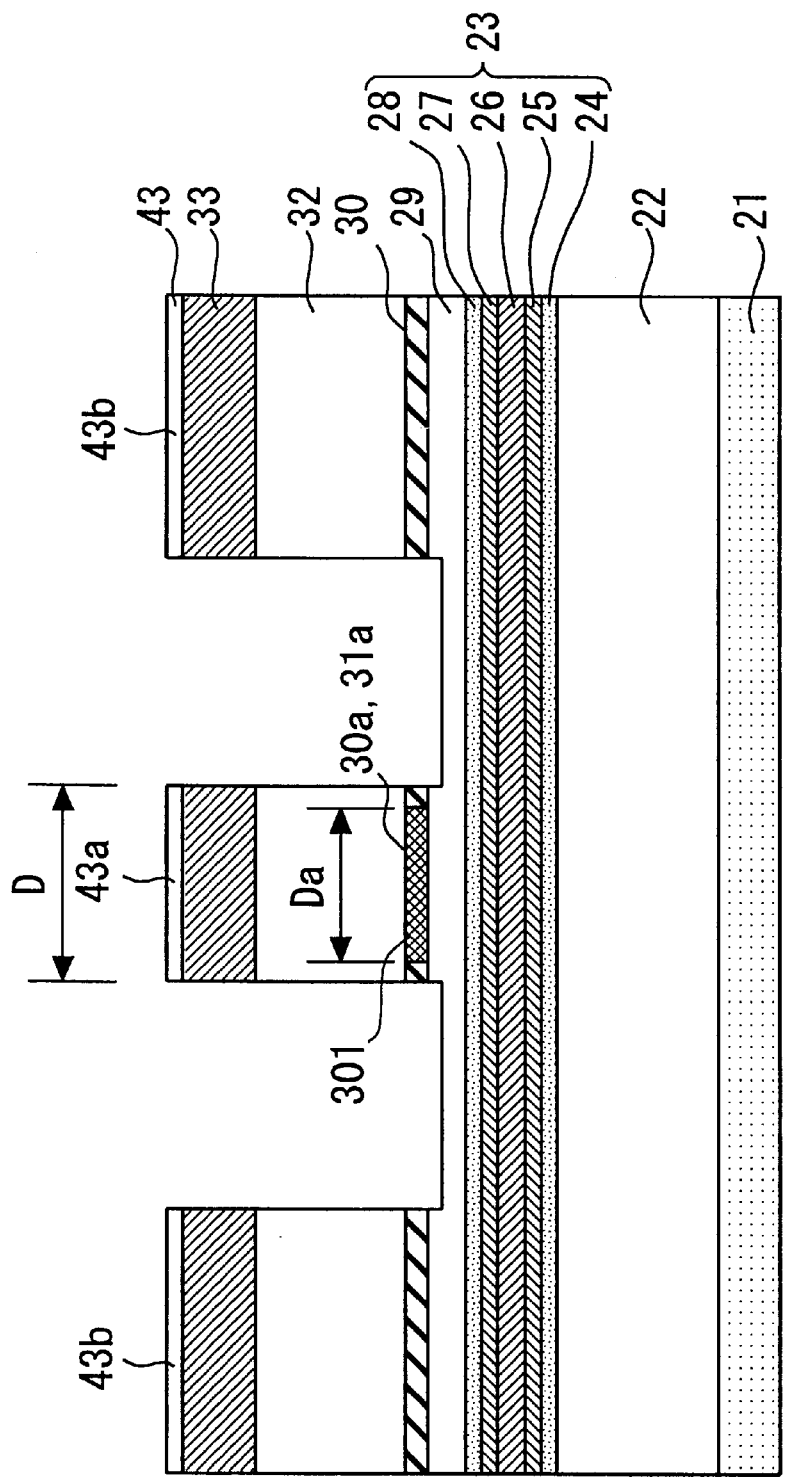
FIG. 33 is a cross-sectional view of the inventive distributed feedback laser device as manufactured in another process of the manufacturing method as the fourth embodiment.

FIG. 33 is a cross-sectional view taken on a plane perpendicular to the optical axis 11 of the semiconductor base 10. This process involves further performing dry etching with the SiO$_2$ film 43 used as a mask, cutting through the P-type InGaAsP layer 30 and partially into the P-type InP layer 29.

Figure 34:
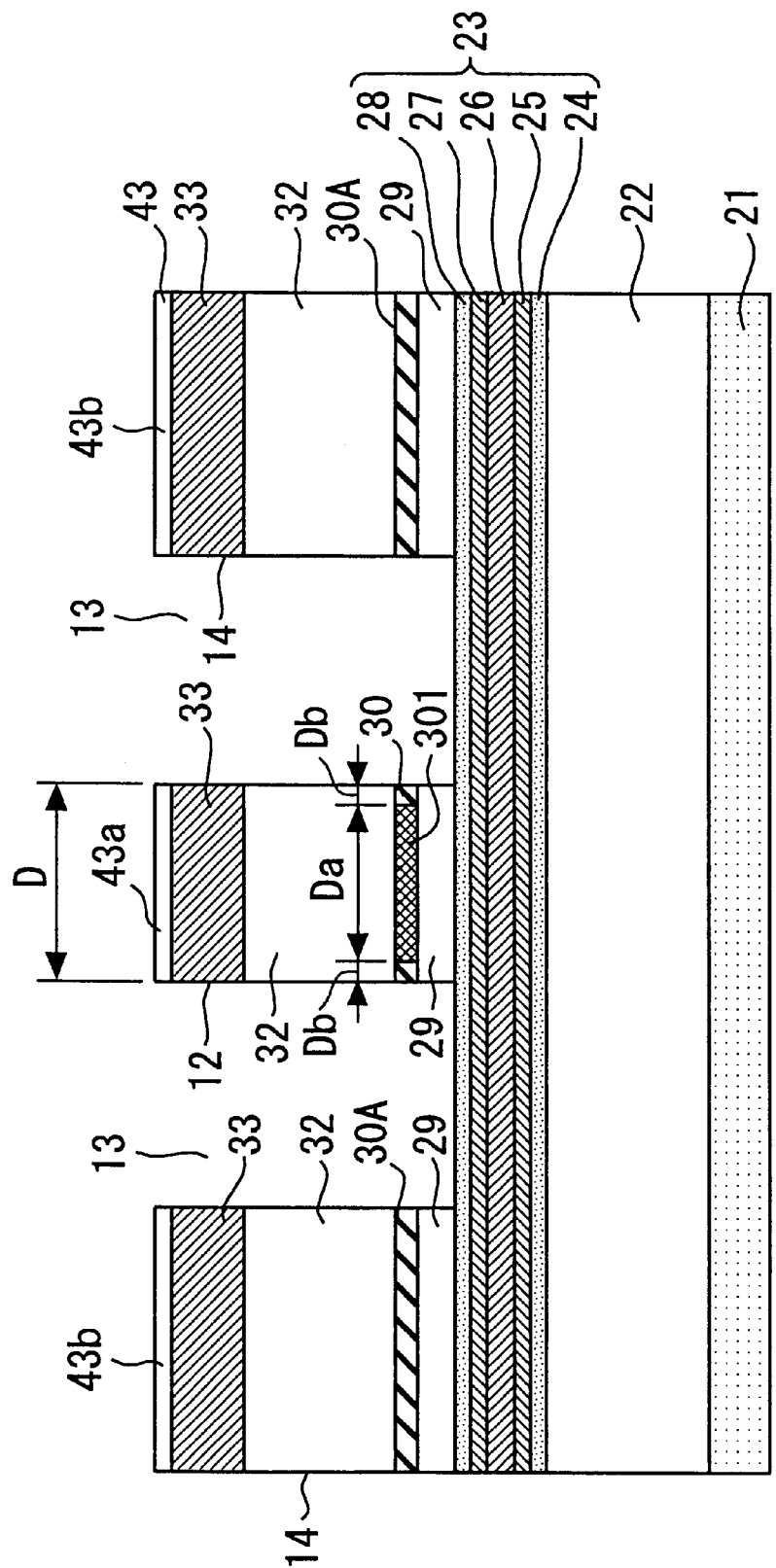
FIG. 34 is a cross-sectional view of the inventive distributed feedback laser device as manufactured in another process of the manufacturing method as the fourth embodiment.

FIG. 34 is a cross-sectional view taken on a plane perpendicular to the optical axis 11 of the semiconductor base 10. This process involves carrying out wet etching following the dry etching of FIG. 33. The etching cuts through the P-type InP layer 29 and stops just when the P-type AlInAs layer 28 is exposed. As a result, the ridge structure 12 is formed in the middle of the semiconductor base 10 and the side walls 14 are formed on both sides of the ridge with the groove 13 located between the ridge and each side wall. The layers 29, 30, 31, 32 and 33 are cut off by the grooves 13. In particular, the layer 30 is differentiated as a layer inside the ridge structure 12, and the cut-off layer 30A as a layer within the side walls 14. The wet etching solution is illustratively a mixture of hydrochloric acid (1 part) and phosphoric acid (2 parts). With this etching solution in use, the etch rate with respect to the AlInAs layer 28 is appreciably smaller than the rate regarding the InP layer 29. However, the AlInAs layer 28 is slightly etched as well. Thus the etching time is to be determined by taking the etch rate into consideration.

The width of the ridge structure 12 is dependent on the width D of the middle element 43a of the SiO$_2$ film 43. In this case, the width D of the middle element 43a is set to be slightly greater than the width Da of the diffraction grating layer 301. It follows that if the center line of the middle element 43a is aligned with the center line of the diffraction grating layer 301 and if the width Da of the grating layer 301 is overlaid with the middle element 43a, then the grating elements 30a of the diffraction grating layer 301 are accommodated inside the width D of the ridge structure 12. In other words, the diffraction grating 301 may be formed in a manner being confined inside the width D of the ridge structure 12, the width Da being less than the width D.

Figure 35:
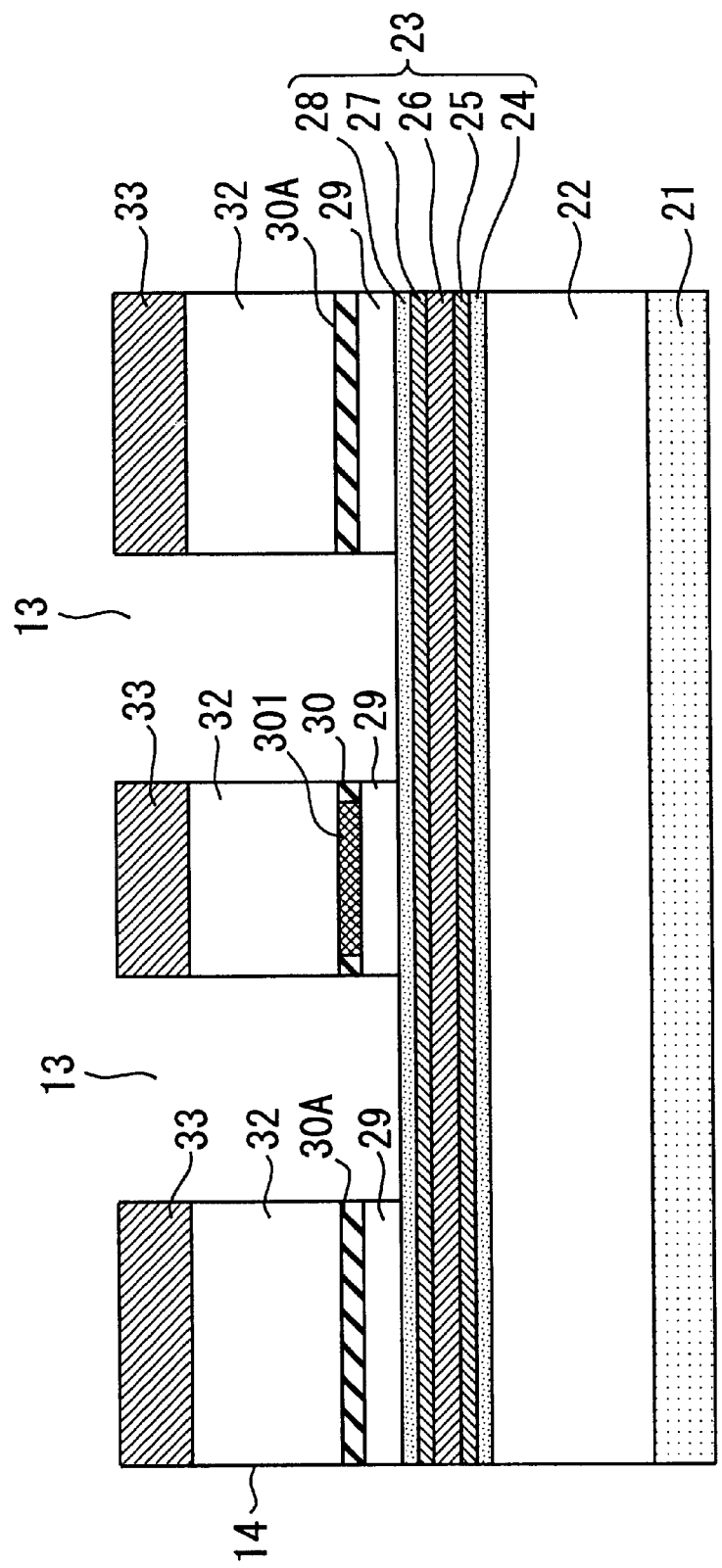
FIG. 35 is a cross-sectional view of the inventive distributed feedback laser device as manufactured in another process of the manufacturing method as the fourth embodiment.
Figure 36:
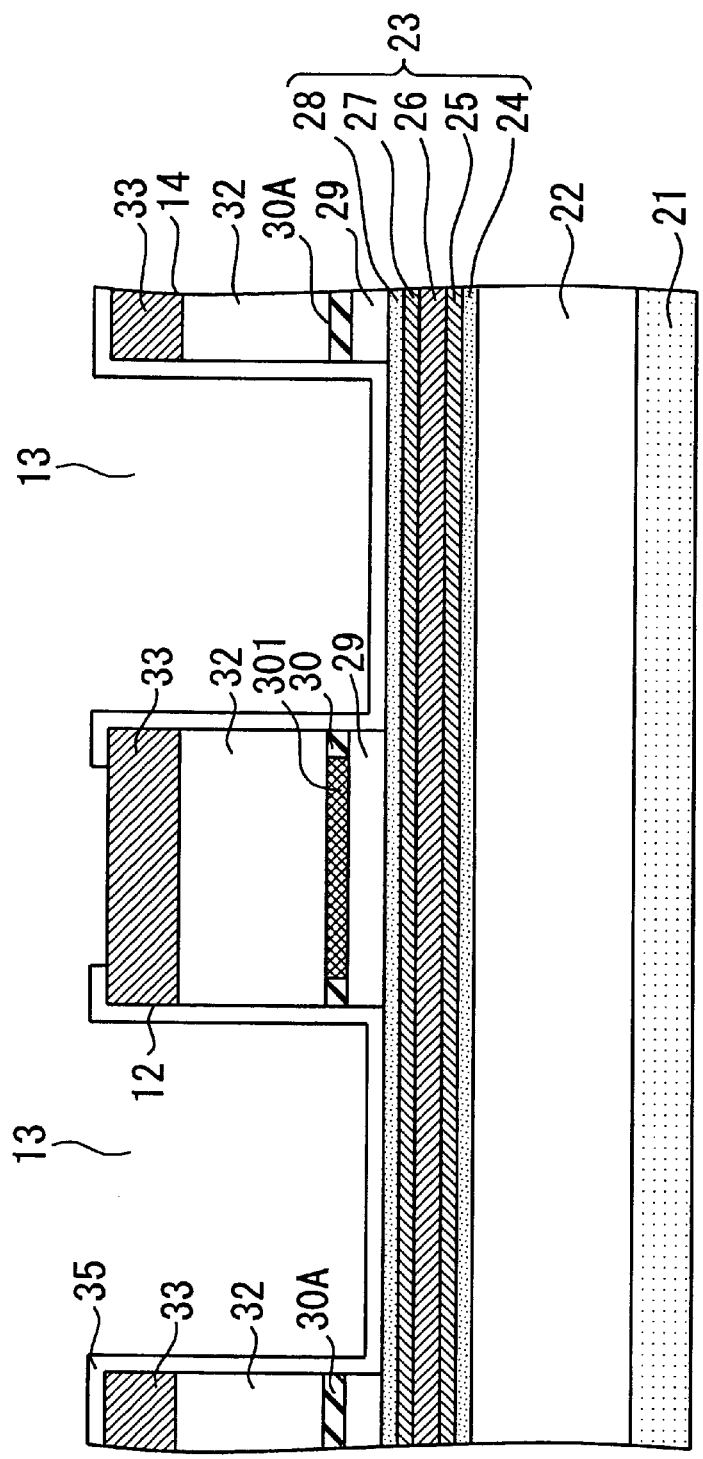
FIG. 36 is a cross-sectional view of the inventive distributed feedback laser device as manufactured in another process of the manufacturing method as the fourth embodiment.

FIGS. 35 and 36 are each a cross-sectional view taken on a plane perpendicular to the optical axis 11 of the semiconductor base 10. The process of FIG. 35 when carried out removes the SiO$_2$ film 43. In the next process in FIG. 36, a new SiO$_2$ film 35 is furnished over the entire surface before being selectively perforated at the top of the ridge structure 12. A finished distributed feedback laser device is shown in FIG. 20. In this completed state, a P-type electrode 36 is formed on the SiO$_2$ film 35 and brought into contact through the latter's openings into the contact layer 33 of the ridge structure 12. An N-type electrode 37 is formed over the lower principal plane 10b of the semiconductor base 10.

In the third and the fourth embodiment, the width Da of the diffraction grating layer 301 is less than the width D of the ridge structure 12 so that the grating layer 301 is confined within the ridge structure 12. If the diffraction grating layer 301 has the same width as the ridge structure 12 as in the case of the first and the second embodiment, a mask misalignment may cause one end of the grating layer 30 to protrude from the ridge structure 12. In that portion of the grating layer 30 which projects out of the ridge structure 12, the grating elements 30a and element-free parts will then alternate in the direction of the optical axis 11. In such a case, the wet etching process of FIG. 32 is stopped at the grating elements 30a but is allowed to progress where these elements are absent.

The P-type InGaAsP layer 30 is then subjected to dry etching and the P-type InP layer 29 to wet etching. The wet etching is stopped at the layer 28. In those parts of the layer 30 where the grating elements 30a are absent, the layer 28 is exposed to etching over a prolonged period of time and is thus etched slightly. The procedure is liable to provoke deviations in laser diode characteristics. In the third and the fourth embodiment, the width Da of the grating layer 301 is made 0.2 μm less than the width D of the ridge structure 12. This means that a misalignment of up to ±0.1 μm (i.e., within a positioning tolerance of photolithography) will not keep the diffraction grating layer 301 from being formed inside the ridge structure 12 in a well-controlled manner. Thus the etching is performed through the layers 30 and 29 and stopped at the layer 28 in an accurately controlled fashion, whereby variations in laser diode characteristics are minimized.

Fifth Embodiment

Figure 37:
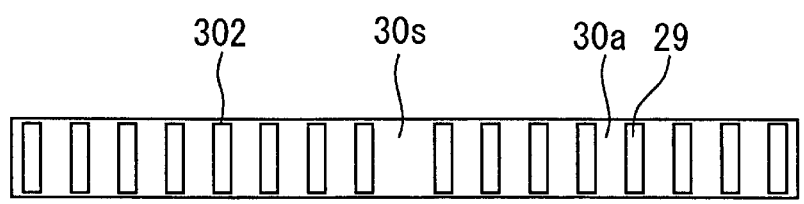
FIG. 37 is a top view showing major parts of a distributed feedback laser device practiced as a fifth embodiment of this invention.

FIG. 37 is a top view of a diffraction grating layer 302 as part of a distributed feedback (DFB) laser device practiced as the fifth embodiment of this invention. The fifth embodiment has grating elements 30a arranged differently from those in the first and the third embodiment. The other structural features of the fifth embodiment are the same as those of the first and the third embodiment, including the fact that the grating elements 30a are confined within the ridge structure 12. The diffraction grating layer 302 is formed as a λ/4 shift diffraction grating with respect to the wavelength λ of oscillated light. That is, the grating layer 302 is constituted by numerous grating elements 30a arranged at constant pitches "d" for a λ/4 phase shift of diffraction grating in the middle of the optical axis 11. Specifically, a λ/4 shift portion 30s having an extensive grating element spacing is located in the middle of the optical axis 11. The width of each grating element 30a in the diffraction grating layer 302 is set to be approximately the same as the width D of the ridge structure 12 as in the first and the second embodiment of FIGS. 1, 2 and 3, or to be less (Da) than the ridge width D as in the third and the fourth embodiment of FIGS. 4 and 5. In FIG. 37, a plurality of rectangular portions are regions free of the grating elements 30a. The multiple grating elements 30a are located alternately between these rectangular portions.

The λ/4 shift diffraction grating, when practiced, provides a better yield of single mode oscillation by the distributed feedback (DFB) laser device than a commonly used, uniformly arranged diffracting grating regardless of the edge phase of the grating. The improved yield promises enhanced optical output.

Sixth Embodiment

Figure 38A:
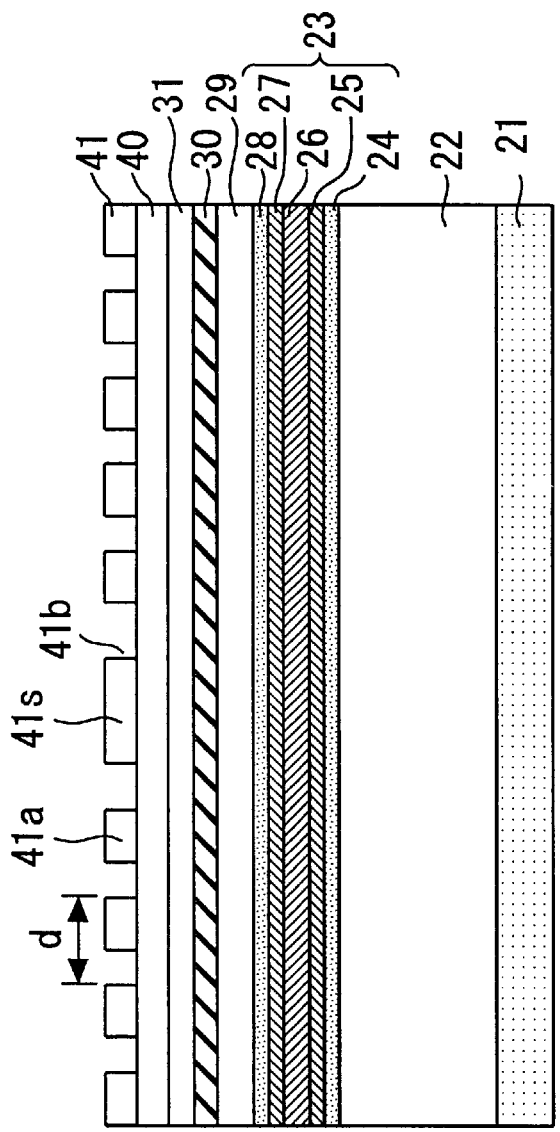
FIGS. 38A and 38B are a cross-sectional view and a top view of the inventive distributed feedback laser device of FIG. 37 as manufactured in one process of a distributed feedback laser device manufacturing method implemented as a sixth embodiment of this invention.
Figure 38B:
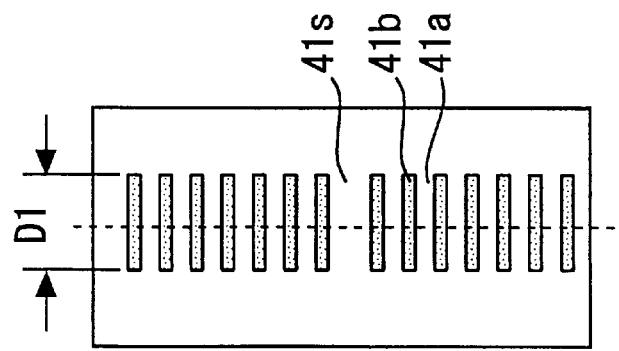

FIGS. 38A and 38B depict the sixth embodiment of this invention in the form of a method for manufacturing the distributed feedback semiconductor laser device shown in FIG. 37. What FIGS. 38A and 38B illustrate corresponds to the processes in FIGS. 5A and 5B as well as in FIGS. 23A and 23B. FIG. 38A on the right is a cross-sectional view taken along the optical axis 11, and FIG. 38B on the left is a top view of the device being manufactured. In this process, the resist film 41 on the SiO$_2$ film 40 is patterned. In correspondence with the grating elements 30a of the grating layer 302, a λ/4 shift portion 41s is formed by EB exposure in the middle of numerous film elements 41a of the resist film 41. With this pattern in use, the diffraction grating layer 302 is manufactured by the same processes as those in FIGS. 3 through 19 or in FIGS. 21 through 34.

Seventh Embodiment

Figure 39:
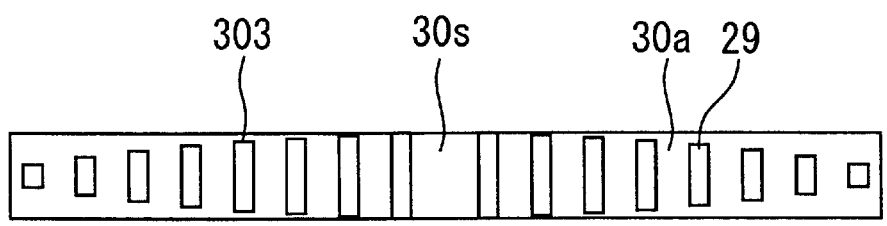
FIG. 39 is a top view depicting major parts of a distributed feedback laser device practiced as a seventh embodiment of this invention.

FIG. 39 illustrates a distributed feedback laser device practiced as the seventh embodiment of this invention. More specifically, FIG. 39 is a top view of a chirped diffraction grating layer 303 of the seventh embodiment. A plurality of grating elements 30a of the chirped diffraction grating layer 303 vary in width along the optical axis 11. Specifically, the grating elements in the middle have a maximum width Dmax, those toward both ends have progressively reduced widths, and those at both ends have a minimum width Dmin. In addition, a λ/4 shift portion 30s similar to that of the fifth or the sixth embodiment is provided in the middle. The width Dmax is approximately the same as the width D of the ridge structure 12. The other structural features of the seventh embodiment are the same as those of the first and the second embodiment. In FIG. 39, a plurality of rectangular portions are regions free of the grating elements 30a. The multiple grating elements 30a are located alternately between these rectangular portions.

Figure 40:
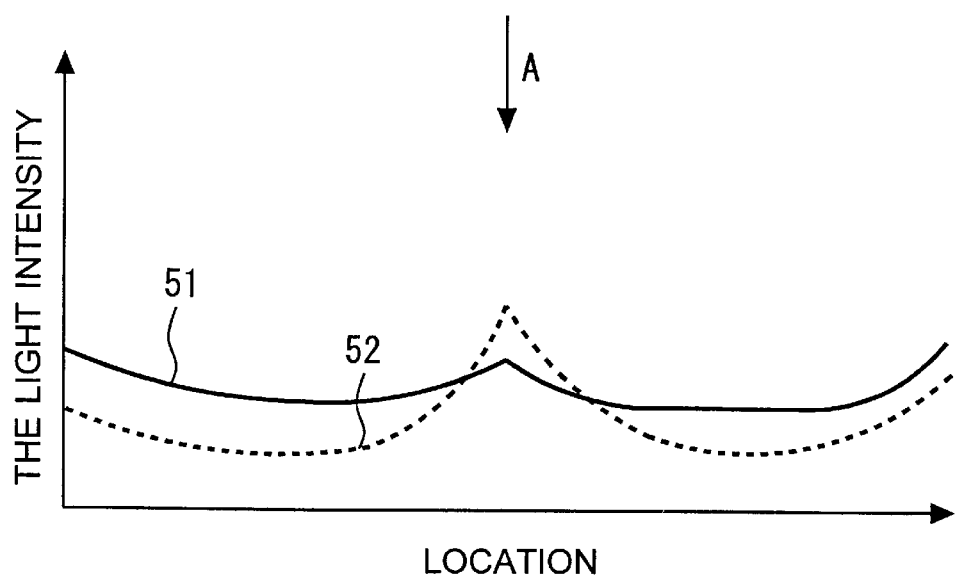
FIG. 40 is a light intensity distribution diagram of the distributed feedback laser device as the seventh embodiment.

Equipped with the chirped diffraction grating layer 303, the seventh embodiment provides a more uniform light intensity distribution than comparable setups having the commonly used λ/4 shift diffraction grating, as shown in FIG. 40. As a result, the seventh embodiment reduces spatial hole burning, improves linearity of optical output and current characteristics, and constitutes a distributed feedback laser device of minimal distortion. In FIG. 40, a characteristic curve 51 plots the light intensity of the seventh embodiment while a characteristic curve 52 indicates for reference the light intensity in effect when the commonly used λ/4 shift diffraction grating is in place. The horizontal axis of FIG. 40 represents locations in the direction of the optical axis 11. An arrow A indicates where the λ/4 shift portion 30s is located.

Eighth Embodiment

Figure 41A:
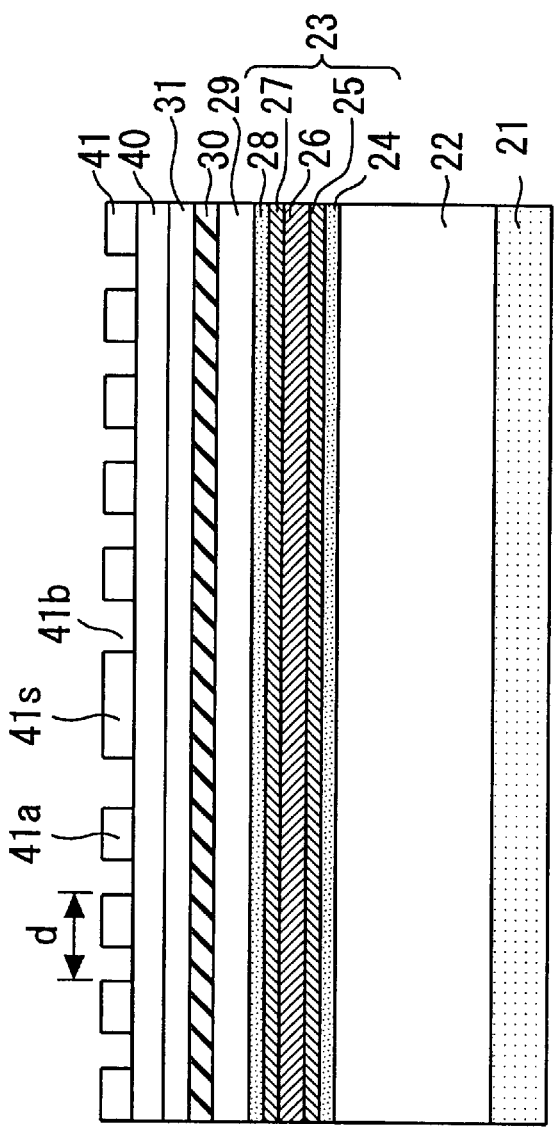
FIGS. 41A and 41B are a cross-sectional view and a top view of the inventive distributed feedback laser device of FIG. 39 as manufactured in one process of a distributed feedback laser device manufacturing method implemented as an eighth embodiment of this invention.
Figure 41B:
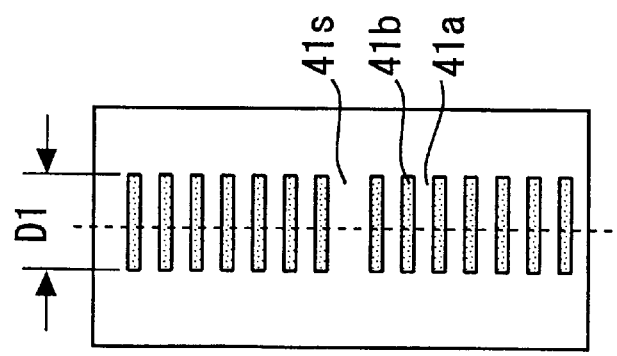

While distributed feedback laser devices having the chirped diffraction grating layer 303 were difficult to manufacture conventionally, this invention offers easy processes for producing just that type of laser device. FIGS. 41A and 41B depict the eighth embodiment of this invention in the form of a method for manufacturing the distributed feedback semiconductor laser device as the seventh embodiment discussed above. On the whole, the processes involved are similar to those in FIGS. 3 through 19 or in FIGS. 21 through 36. The description below will focus on some aspects of the eighth embodiment that are specifically different from those of the other embodiments.

The processes in FIGS. 3, 4, 21 and 22 are the same as those of the eighth embodiment. What FIGS. 41A and 41B show corresponds to the processes in FIGS. 5A and 5B, in FIGS. 23A and 23B, as well as in FIGS. 38A and 38B. FIG. 41A on the right is a cross-sectional view taken along the optical axis 11, and FIG. 41B on the left is a top view of the device being manufactured. In this process, a shift portion 41s corresponding to the λ/4 shift portion 30s is furnished additionally to the resist film 41. The λ/4 shift portion 41s is located centrally in the direction of the optical axis 11, and is made axially longer than the other film elements 41a of the resist film 41 in the direction of the optical axis 11.

Figure 24:
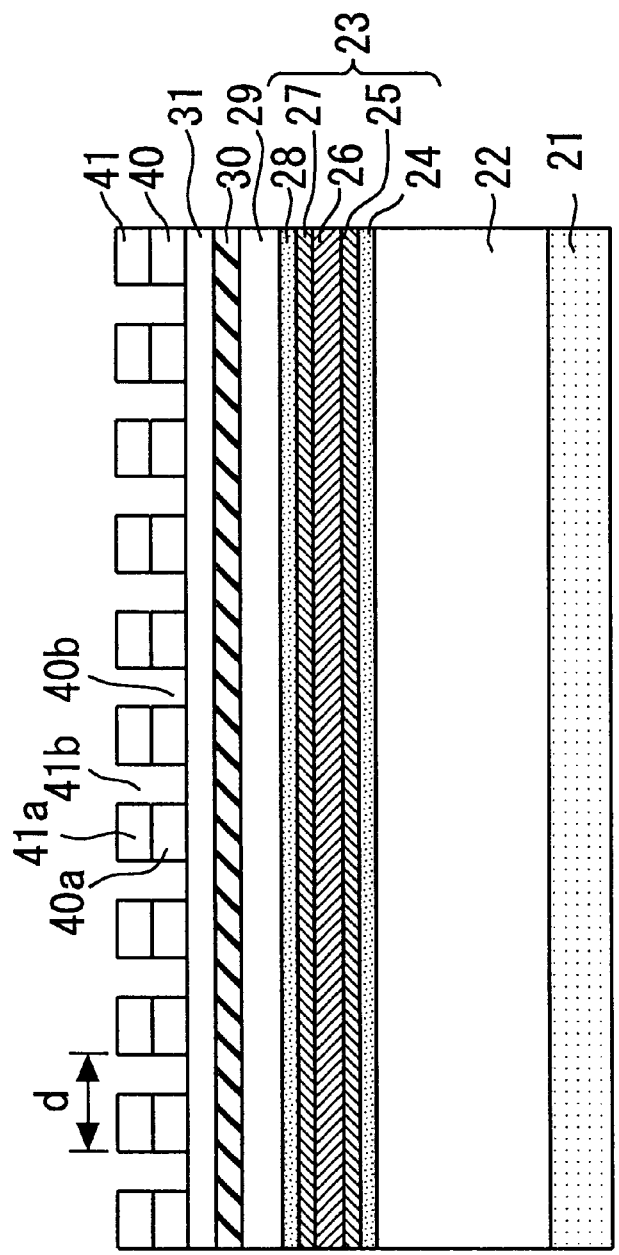
FIG. 24 is a cross-sectional view of the inventive distributed feedback laser device as manufactured in another process of the manufacturing method as the fourth embodiment.
Figure 42:
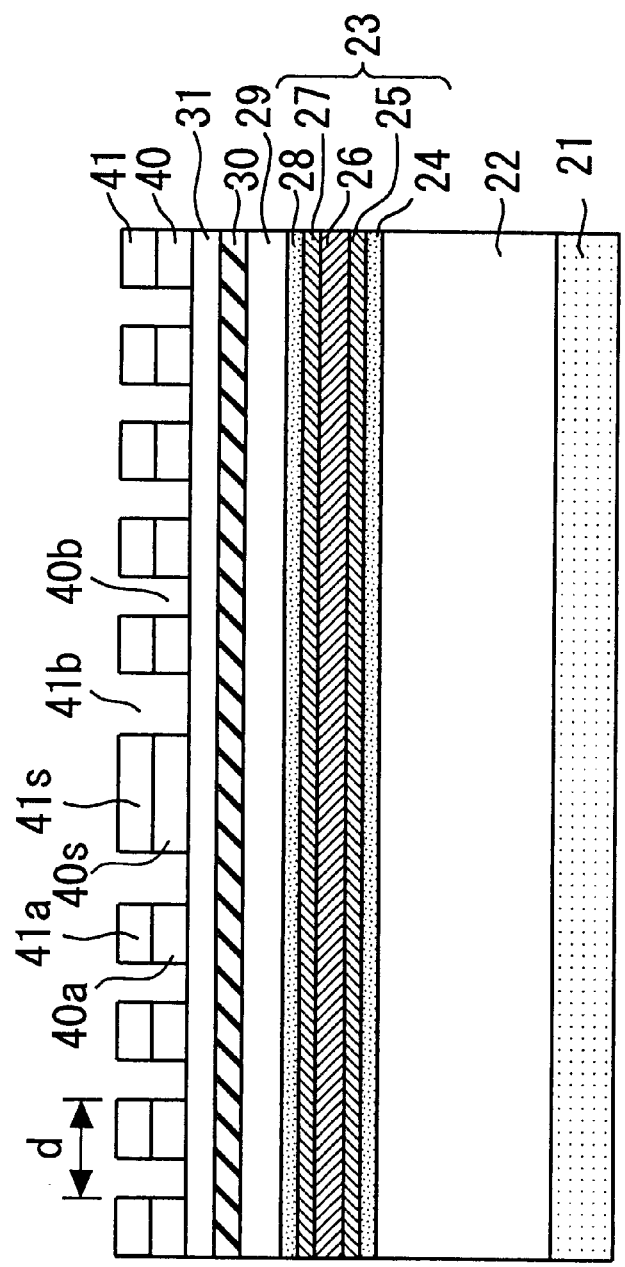
FIG. 42 is a cross-sectional view of the inventive distributed feedback laser device as manufactured in another process of the manufacturing method as the eighth embodiment.

The process in FIG. 42 corresponds to what is depicted in FIGS. 6 and 24. In this process, a shift portion 40s is formed in the middle of numerous film elements 40a of the SiO$_2$ film 40; the portion 40s is made longer along the optical axis 11 than the other film elements 40a.

Figure 7:
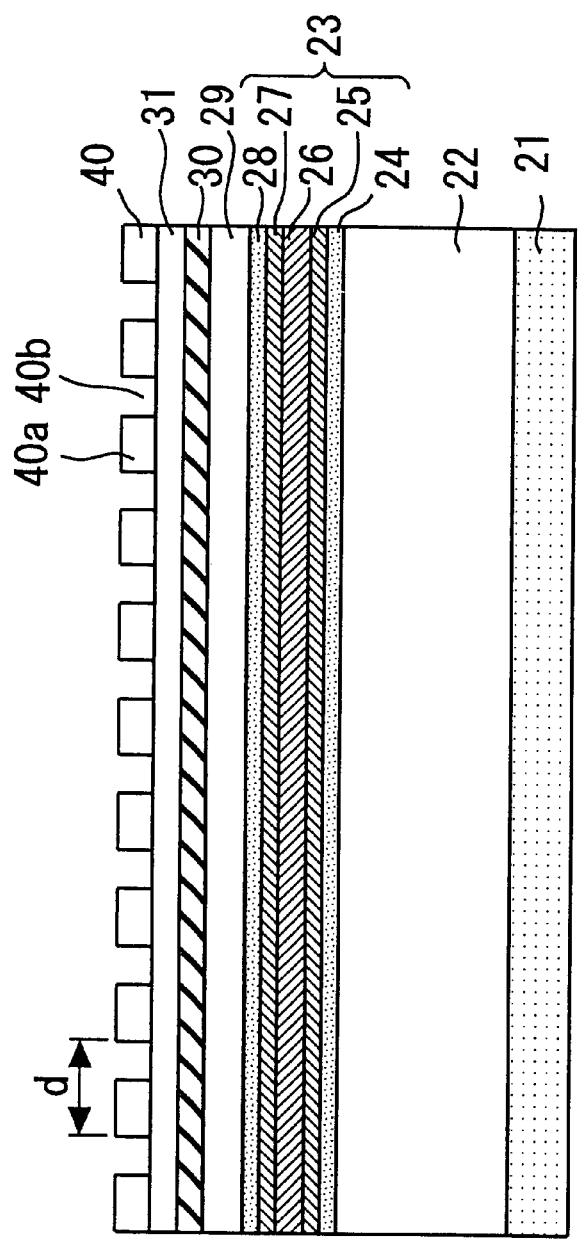
FIG. 7 is a cross-sectional view of the inventive distributed feedback laser device as manufactured in another process of the manufacturing method as the second embodiment.
Figure 25:
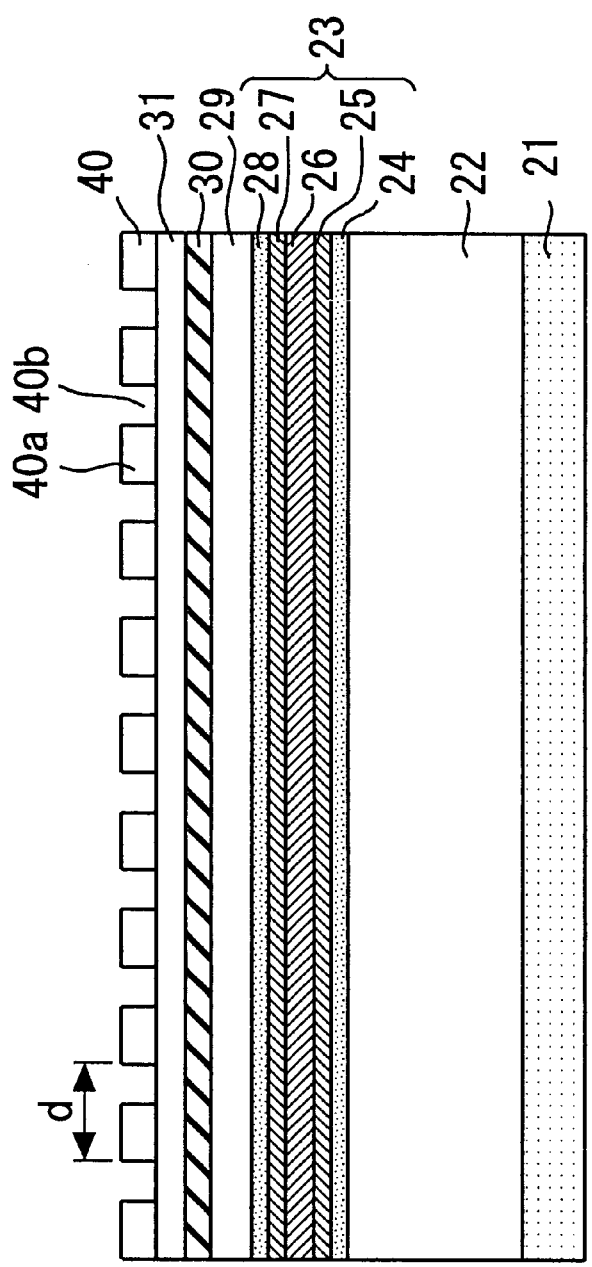
FIG. 25 is a cross-sectional view of the inventive distributed feedback laser device as manufactured in another process of the manufacturing method as the fourth embodiment.
Figure 43:
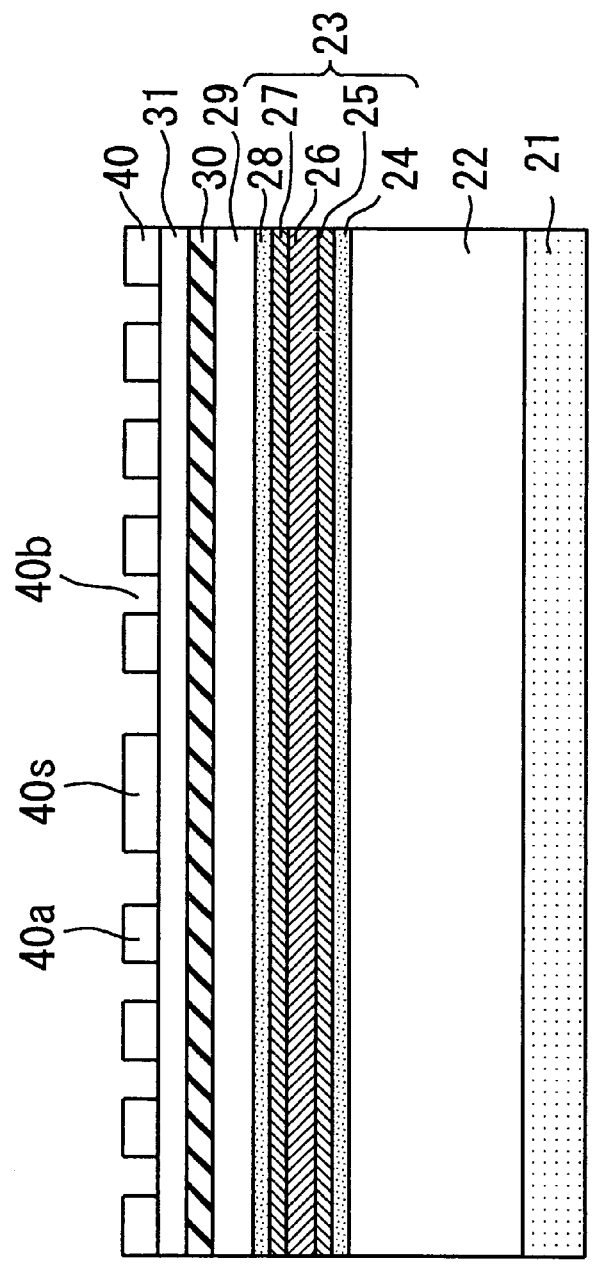
FIG. 43 is a cross-sectional view of the inventive distributed feedback laser device as manufactured in another process of the manufacturing method as the eighth embodiment.

The process in FIG. 43 corresponds to what is shown in FIGS. 7 and 25. This process is carried out to remove the resist film 41, leaving intact the SiO$_2$ film 40 having the film elements 40a including the shift portion 40s.

Figure 44A:
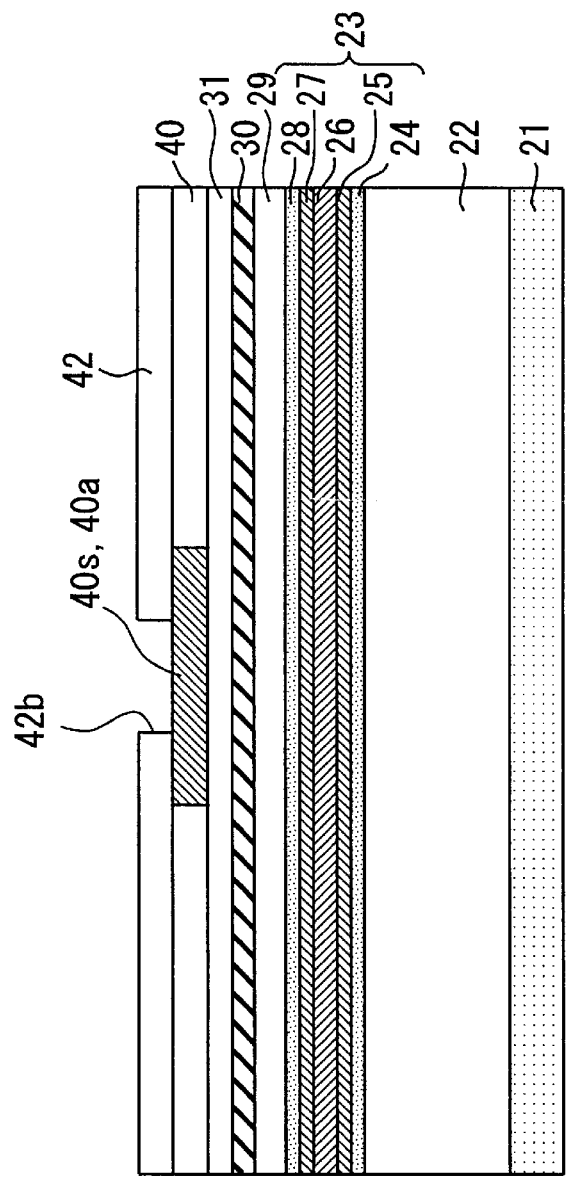
FIGS. 44A and 44B are a cross-sectional view and a top view of the inventive distributed feedback laser device as manufactured in another process of the manufacturing method as the eighth embodiment.
Figure 44B:
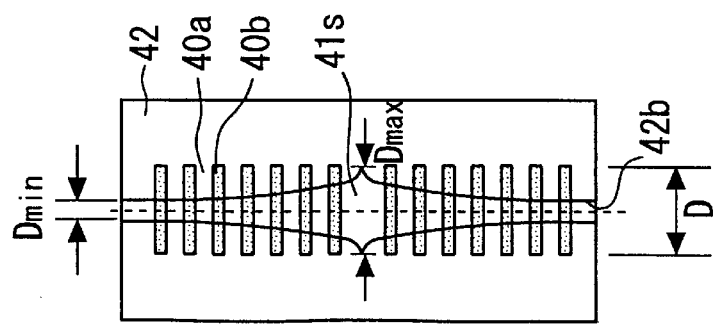

What FIGS. 44A and 44B illustrate corresponds to the processes in FIGS. 8A and 8B as well as in FIGS. 26A and 26B. FIG. 44A on the right is a cross-sectional view taken along the optical axis 11, and FIG. 44B on the left is a top view of the device being manufactured. In this process, a new resist film 42 is formed on the SiO$_2$ film 40. In the middle of the resist film 42, a slit 42b is formed in the direction of the optical axis 11. As shown in FIG. 44B, the slit 42b has a maximum width Dmax in the middle of the optical axis 11, becomes narrower toward both ends of the axis, and has a minimum width Dmin at both ends. The slit 42b is overlaid with the multiple film elements 40a of the SiO$_2$ film 40 in such a manner that a center line of the slit 42b is aligned with that of the elements 40a.

Figure 45A:
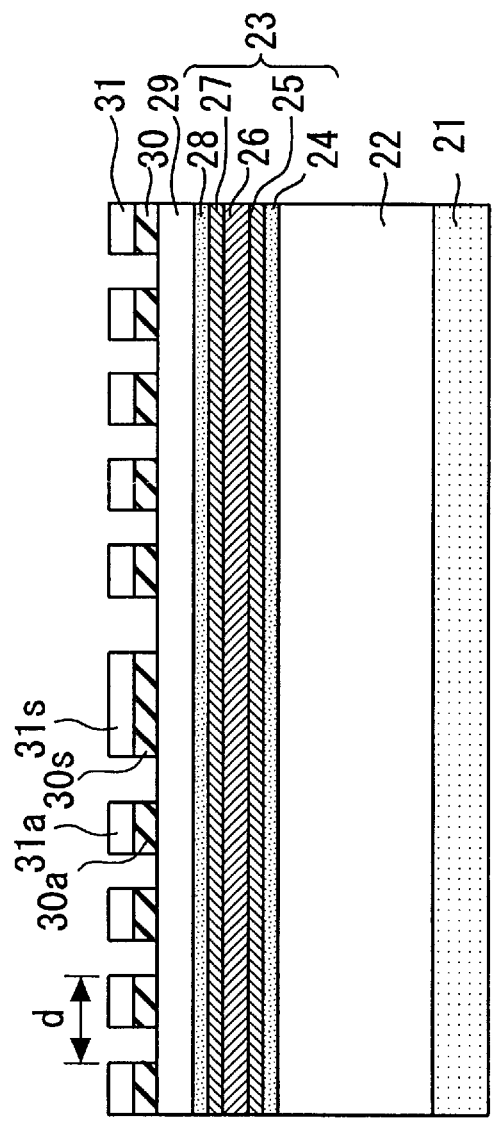
FIGS. 45A and 45B are a cross-sectional view and a top view of the inventive distributed feedback laser device as manufactured in another process of the manufacturing method as the eighth embodiment.
Figure 45B:
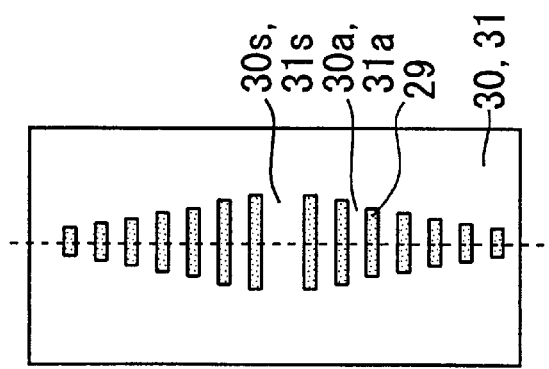
Figure 46:
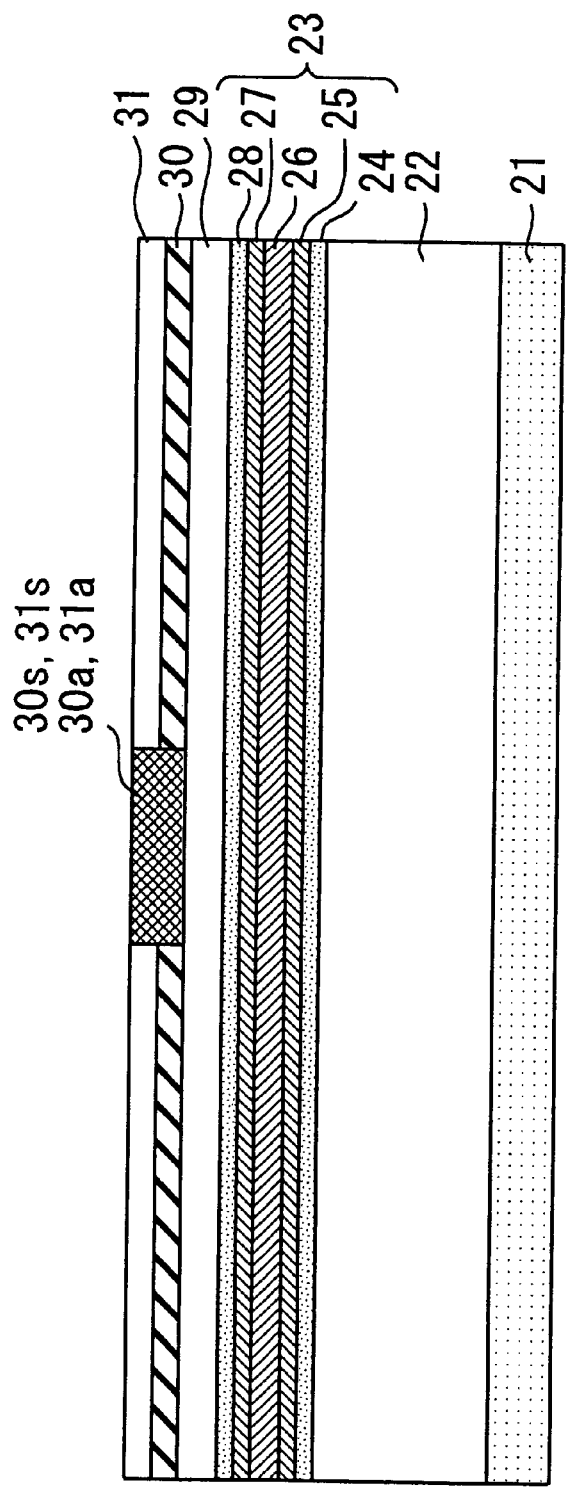
FIG. 46 is a cross-sectional view of the inventive distributed feedback laser device as manufactured in another process of the manufacturing method as the eighth embodiment.

What FIGS. 45A and 45B depict corresponds to the processes in FIGS. 9A and 9B as well as in FIGS. 27A and 27B. FIG. 45A on the right is a cross-sectional view taken along the optical axis 11, and FIG. 45B on the left is a top view of the device being manufactured. In this process, etching is carried out with the SiO$_2$ film 40 and resist film 42 used as masks so as to pattern the layers 31 and 30 into a plurality of grating elements 31a and 30a. The grating elements have λ/4 shift portions 30s and 31s formed centrally along the optical axis 11 with a maximum width Dmax each; the elements toward both ends have progressively reduced widths, and those at both ends have a minimum width Dmin. FIG. 46 is a cross-sectional view taken on a plane perpendicular to the optical axis 11 of the semiconductor base 10 in the process of FIG. 45. FIG. 46 corresponds to what is shown in FIGS. 10 and 28.

The ridge structure 12 and side walls 14 are subsequently formed in the same processes as those in FIGS. 11 through 19 and in FIGS. 29 through 36. The width D of the ridge structure 12 is approximately the same as the maximum width Dmax. The ridge structure 12 is formed so that the maximum width Dmax is accommodated precisely within the ridge width D. The diffraction grating layer 303 is thus confined inside the ridge structure 12.

Alternatively, the maximum width Dmax of the diffraction grating layer 303 may be less (Da) than the width D of the ridge structure, as in the case of the embodiments depicted in FIG. 20 and in FIGS. 21 through 36.

As described and according to one aspect of the invention, a distributed feedback laser device is manufactured so that its diffraction grating layer is confined within the ridge waveguide structure. This permits enlarging of the coupling constant in effect between emitted light and the grating layer, thus boosting optical output and ensuring wavelength stabilization.

In a preferred variation of the inventive laser device, the diffraction grating layer is made narrower than the ridge waveguide structure. This arrangement prevents possible mask misalignment from causing the diffraction grating layer to project from the ridge waveguide structure. Wavelength dispersions attributable to such layer projections are thus eliminated.

In another preferred variation of the inventive laser device, a diffraction grating layer having a portion for a ¼ shift of a resonant wavelength is utilized. This arrangement improves the yield of single mode oscillation.

In another preferred variation of the inventive laser device, the use of a chirped diffraction grating layer provides an improved light intensity distribution characteristic.

The manufacturing method according to another aspect of the invention involves first forming a diffraction grating layer having a plurality of grating elements arranged within a predetermined width. So that a ridge waveguide structure is then formed in such a manner that the diffraction grating layer is left confined inside the ridge structure.

In one variation of the inventive manufacturing method, etching is carried out to form the diffraction grating layer using as masks both an SiO$_2$ film having a plurality of film elements each wider than the predetermined width and a resist film comprising a slit for opening the film elements to the predetermined width each. This makes it possible precisely to form grating elements having the necessary width and a suitable pitch.

In another variation of the inventive manufacturing method, etching is performed to produce the ridge waveguide structure using the diffraction grating layer as an etching stopper with respect to semiconductor layers covering the grating layer. This makes it possible to better control the etching process with higher precision than before.

The entire disclosure of a Japanese Patent Application No. 2000-352450, filed on Nov. 20, 2000 including specification, claims, drawings and summary, on which the Convention priority of the present application is based, are incorporated herein by reference in its entirety.

What is claimed is:

1. A distributed feedback laser device comprising:
 a semiconductor structure including
    a semiconductor base defined by two opposing, general parallel, upper and lower principal planes and including a plurality of semiconductor layers adjacent the upper principal plane for emitting light,
    a ridge waveguide structure projecting from the upper principal plane of said semiconductor base and having a width, and
    a diffraction grating layer resonating with the light emitted from said plurality of semiconductor layers, said ridge waveguide structure extending from a first end of said semiconductor base to an opposite second end of said semiconductor base, and said diffraction grating layer having a plurality of grating elements arranged from the first end of said semiconductor base to the second end, said grating elements each having a width less than the width of said ridge waveguide structure and being confined within said ridge waveguide structure.

2. The distributed feedback laser device according to claim 1, wherein said diffraction grating layer has a plurality of grating elements arranged with a uniform pitch between the first and second ends of said semiconductor base.

3. The distributed feedback laser device according to claim 1, wherein said diffraction grating layer has a portion with a ¼ wavelength shift at a resonant wavelength located in a substantially central location between the first and second ends of said semiconductor base.

4. The distributed feedback laser device according to claim 1, wherein said diffraction grating layer includes a chirped diffraction grating having a plurality of grating elements which vary progressively in width between the first and second ends of said semiconductor base.

5. A method of manufacturing a distributed feedback laser device comprising:
 forming on a semiconductor substrate a plurality of semiconductor layers for emitting light;
 forming on said plurality of semiconductor layers a diffraction grating layer having a plurality of grating elements, the grating elements having a width, including forming said diffraction grating layer using as masks an SiO$_2$ film having a plurality of film elements, each film element being wider than the width, and a resist film comprising a slit opening said film elements to the width; and
 forming, by etching said diffraction grating layer without etching said plurality of semiconductor layers, a ridge waveguide structure with said plurality of grating elements confined within said ridge waveguide structure.

6. The method of manufacturing a distributed feedback laser device according to claim 5, wherein, in etching of said diffraction grating layer to produce said ridge waveguide structure, using said diffraction grating layer as an etching stopper with respect to semiconductor layers covering said diffraction grating layer.

* * * * *